US012652046B2

(12) United States Patent
Ueki

(10) Patent No.: US 12,652,046 B2
(45) Date of Patent: Jun. 9, 2026

(54) SEMICONDUCTOR DEVICE AND POWER SUPPLY CONTROL PROCESSING METHOD FOR CONTROL CIRCUIT OF SEMICONDUCTOR DEVICE

(71) Applicant: RENESAS ELECTRONICS CORPORATION, Tokyo (JP)

(72) Inventor: Hiroshi Ueki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 396 days.

(21) Appl. No.: 18/329,754

(22) Filed: Jun. 6, 2023

(65) Prior Publication Data

US 2023/0403009 A1      Dec. 14, 2023

(30) Foreign Application Priority Data

Jun. 9, 2022      (JP) ................................. 2022-093695

(51) Int. Cl.
  *H03K 19/00*      (2006.01)
  *H10D 84/85*      (2025.01)
  *H10D 89/10*      (2025.01)

(52) U.S. Cl.
  CPC ....... *H03K 19/0016* (2013.01); *H10D 84/856* (2025.01); *H10D 89/10* (2025.01)

(58) Field of Classification Search
  CPC .. H03K 19/0016; H10D 89/10; H10D 84/856; H02M 1/32; H02M 1/0032; H02M 3/155; H02M 1/0045; H02M 1/0006; H02M 1/007; H02M 1/4208; H02M 3/33571; H02M 1/0012; H02M 3/07; H02M 7/219; G05F 1/465; G05F 1/56; G05F 3/16;

Y04S 20/20; H02J 9/005; G06F 1/3296; G06F 1/26; G06F 1/32; G06F 1/3203; G06F 1/3218; G06F 1/3243; G06F 1/3265

See application file for complete search history.

(56)      References Cited

U.S. PATENT DOCUMENTS 7,569,899 B2      8/2009   Kanno et al.

FOREIGN PATENT DOCUMENTS

DE            19700109 A1 * 12/1997   .......... H10D 86/201
JP       2008-060370 A      3/2008
JP            6779960 B2 * 11/2020

* cited by examiner

*Primary Examiner* — Lincoln D Donovan
*Assistant Examiner* — James G Yeaman
(74) *Attorney, Agent, or Firm* — Rimon P.C.

(57)      ABSTRACT

A semiconductor device includes a first regulator electrically connected to a first power supply line, a second regulator electrically connected to a second power supply line, a control circuit configured to control the first and second regulators, and at least two functional circuit modules electrically connectable to the first power supply line and the second power supply line. When all the functional circuit modules are set to a power-on state (active mode), the control circuit controls the first regulator to output a voltage to the first power supply line and the second regulator to output a voltage to the second power supply line, and when some functional circuit modules are set to a power-off state (standby mode), the control circuit controls the first regulator to output a voltage to the first power supply line and the second regulator not to output a voltage to the second power supply line.

9 Claims, 16 Drawing Sheets

$$Cp \cdot Vd = Qp \cdots (1)$$

$$C1 \cdot Vd' = Q1 \cdots (2) \qquad Cp \cdot Vd' = Qp' \cdots (3)$$

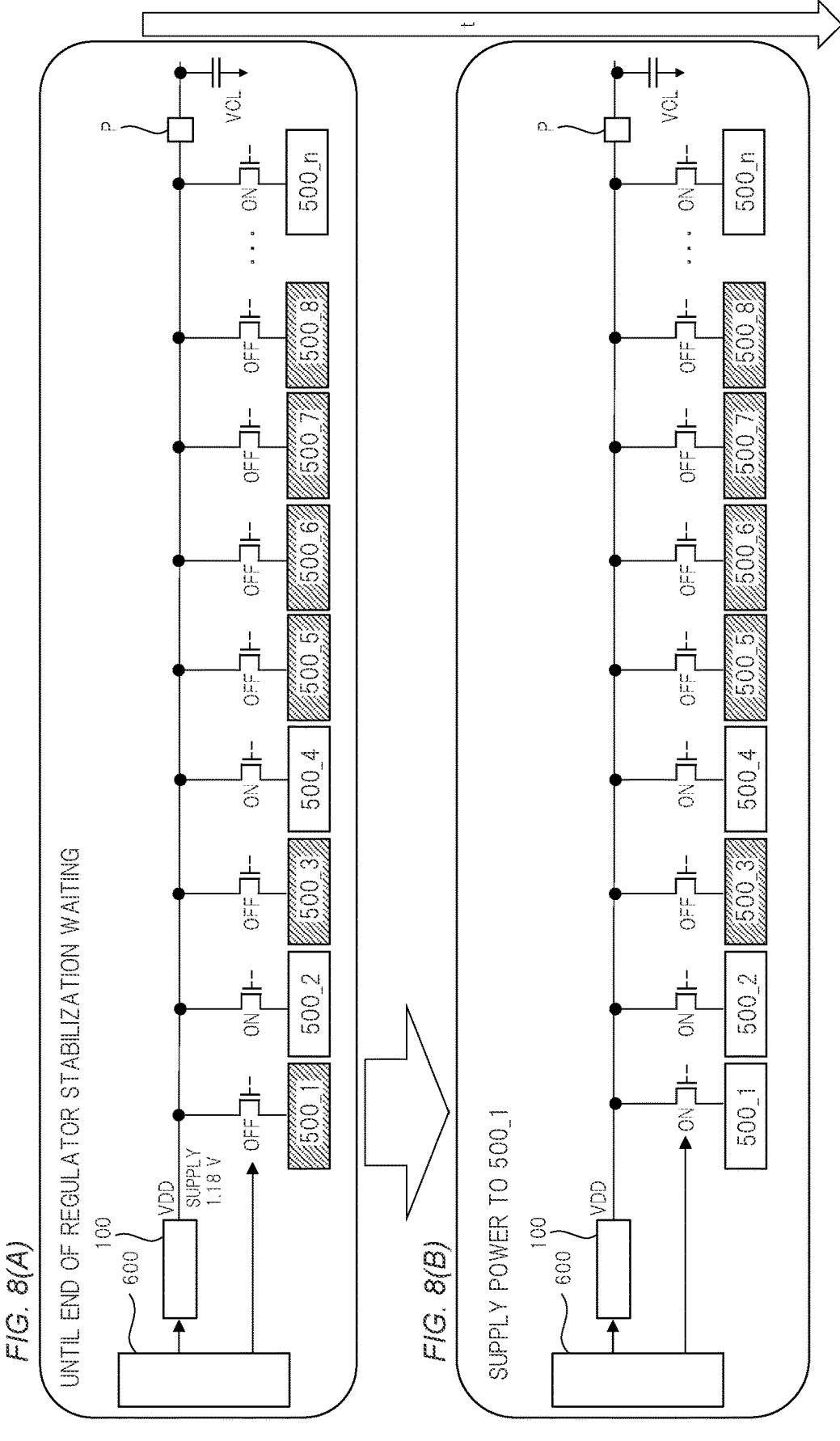

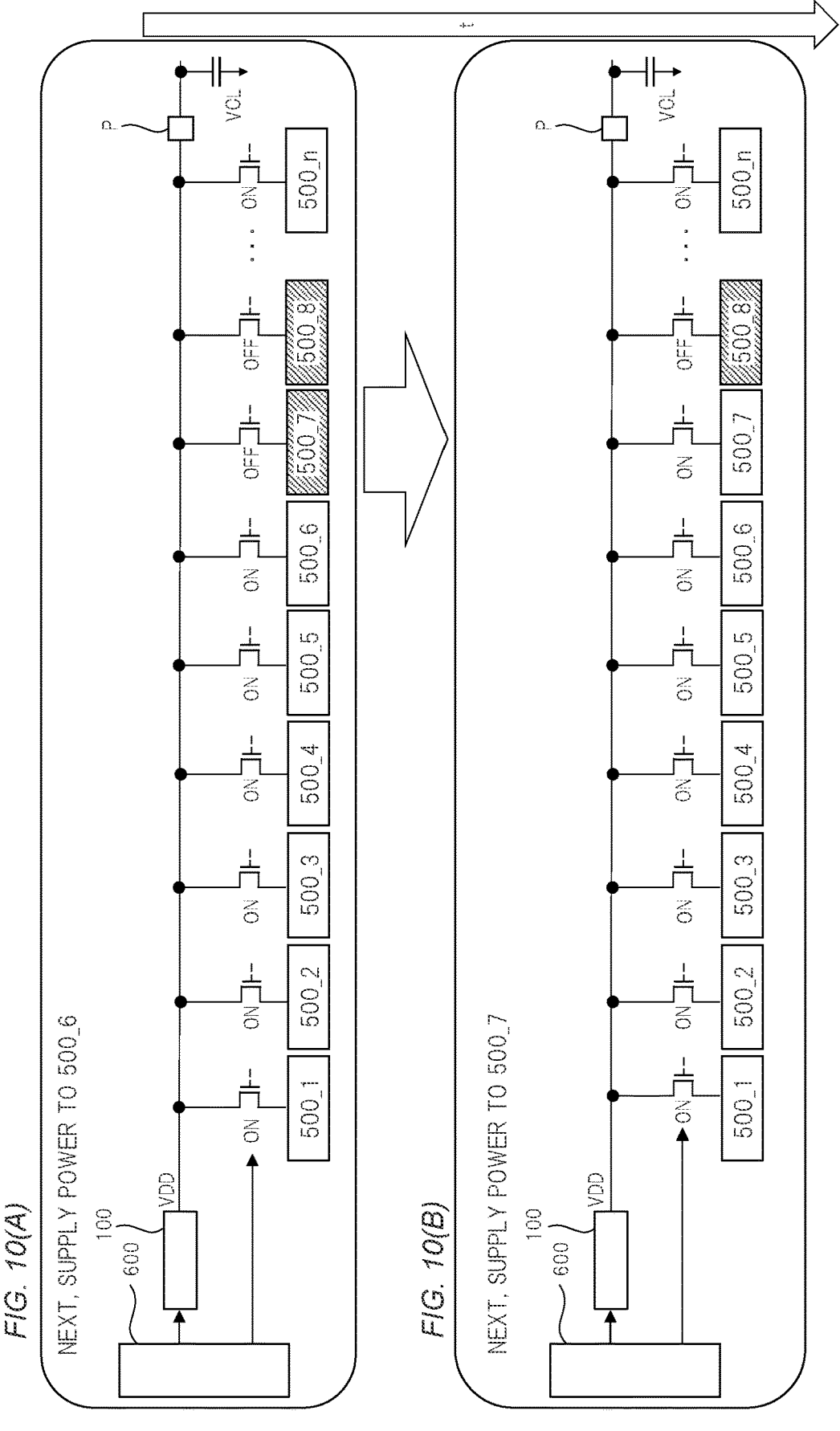

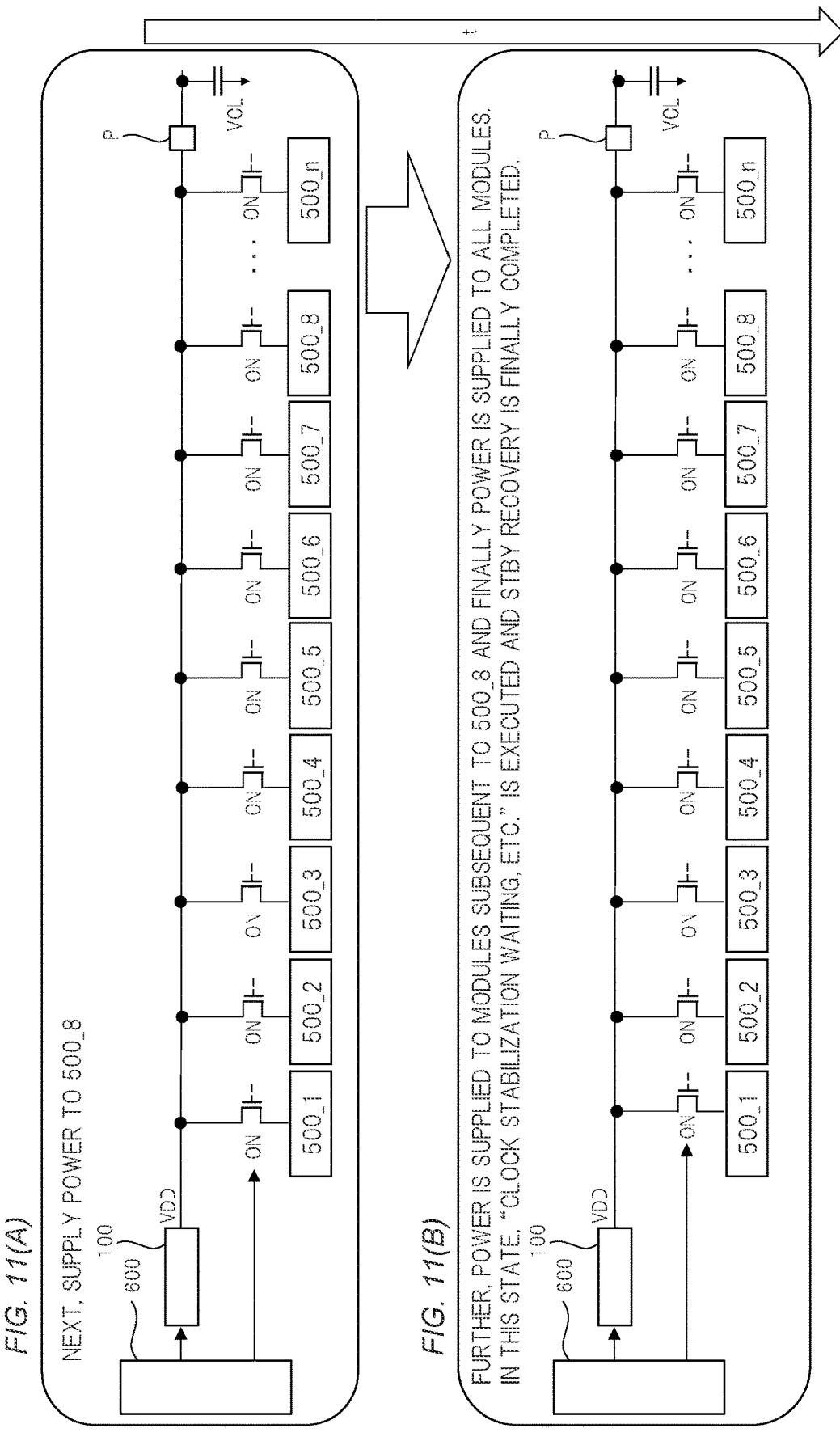

SEMICONDUCTOR DEVICE AND POWER SUPPLY CONTROL PROCESSING METHOD FOR CONTROL CIRCUIT OF SEMICONDUCTOR DEVICE

CROSS-REFERENCE TO RELATED APPLICATIONS

The disclosure of Japanese Patent Application No. 2022-093695 filed on Jun. 9, 2022 including the specification, drawings and abstract is incorporated herein by reference in its entirety.

BACKGROUND

This disclosure relates to a semiconductor device and a power supply control processing method for a control circuit of a semiconductor device, and relates to a technique particularly effective for a standby recovery time of a semiconductor device.

With the recent increase in the scale of MCU (Micro Control Unit) and the trend to multi-core CPU (Central Processing Unit), the power gating function to reduce power consumption during standby mode is becoming an essential function for semiconductor devices.

There is disclosed a technique listed below.
[Patent Document 1] Japanese Unexamined Patent Application Publication No. 2008-060370

For example, Patent Document 1 discloses a technique for reducing the power consumption of a logic LSI by cutting off the power supply to each of circuit blocks having a common power supply line by means of the power gating control of the power switches each composed of a transistor in the logic LSI.

SUMMARY

In spite of the ingenuity in the operation described above, the technique of Patent Document 1 has the problem that the standby recovery time required for transitioning from the power-off state to the power-on state is long because of the common power supply line for each circuit block.

For example, when a mode in which most functions of the MCU are brought into the power-off state is referred to as a standby mode, since the standby mode is a low power consumption state, frequent use of the standby mode reduces the power consumption of the MCU. However, if an interrupt event or the like occurs during the standby mode, it is an essential requirement that the MCU is activated within the interrupt response time required by the system and enters the active mode. If the MCU is not activated within the interrupt response time, it will be impossible to use the standby mode. Namely, if the standby mode recovery time is long, the case where there is no choice but to operate the MCU in the active mode arises, and the function of reducing the power consumption of the MCU may be impaired.

This disclosure has been made in view of the above, and one of the objects thereof is to provide a semiconductor device capable of shortening the standby recovery time for transitioning from the standby mode to the active mode. Other problems and novel features will become apparent from the description of this specification and the accompanying drawings.

An outline of the representative invention disclosed in this application will be briefly described below. A representative semiconductor device includes: includes a first regulator electrically connected to a first power supply line, a second regulator electrically connected to a second power supply line, a control circuit configured to control the first and second regulators, and at least two functional circuit modules electrically connectable to the first power supply line and the second power supply line. When the functional circuit modules are set to an active mode, the control circuit controls the first regulator to output a voltage to the first power supply line and the second regulator to output a voltage to the second power supply line, and when the functional circuit modules are set to a standby mode, the control circuit controls the first regulator to output a voltage to the first power supply line and the second regulator not to output a voltage to the second power supply line.

According to one embodiment, it is possible to provide a semiconductor device capable of shortening the standby recovery time for transitioning from the power-off state to the power-on state.

BRIEF DESCRIPTION OF THE DRAWINGS

FIG. 8(A) is a block diagram showing an example of the configuration and operating state in the period from the STBY mode of the semiconductor device according to the comparative example shown in FIG. 7 to the end of the regulator stabilization waiting state.

FIG. 8(B) is a block diagram for describing an example of the configuration and operating state when power is supplied to a functional circuit module 500_1 of the semiconductor device according to the comparative example in FIG. 8(A).

FIG. 10(A) is a block diagram for describing an example of the configuration and operating state when power is supplied to a functional circuit module 500_6 of the semiconductor device according to the comparative example in FIG. 9(B).

FIG. 10(B) is a block diagram for describing an example of the configuration and operating state when power is supplied to a functional circuit module 500_7 of the semiconductor device according to the comparative example in FIG. 10(A).

FIG. 11(A) is a block diagram for describing an example of the configuration and operating state when power is supplied to a functional circuit module 500_8 of the semiconductor device according to the comparative example in FIG. 10(B).

FIG. 11(B) is a block diagram for describing an example of the configuration and operating state when power is supplied to the other functional circuit modules in the power-off state of the semiconductor device according to the comparative example in FIG. 11(A) and clock stabilization waiting, etc. is executed.

DETAILED DESCRIPTION

Figures 1A, 1B:
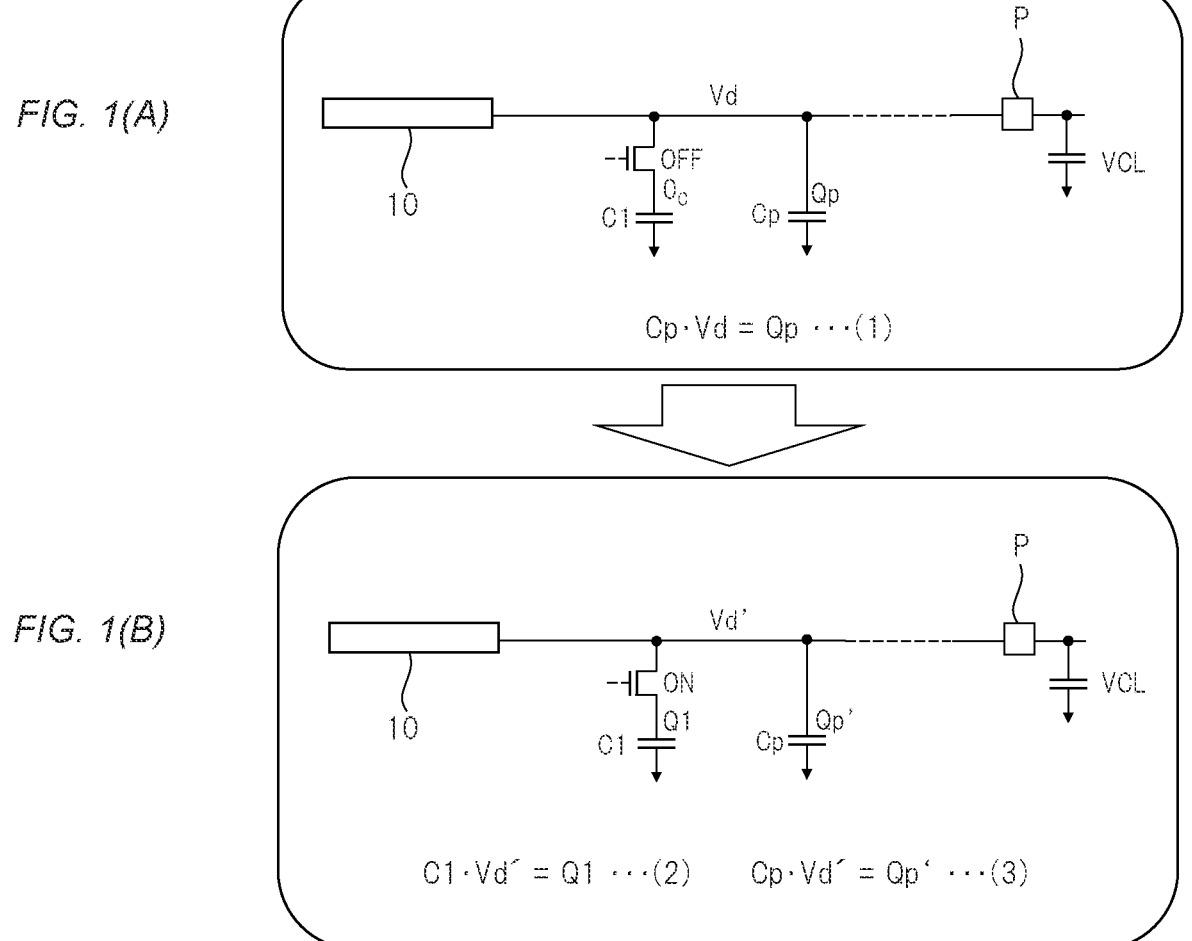
FIG. 1(A) is a diagram showing in a simplified manner the principle of a relationship among electric charge, capacitor capacitance, and voltage applied to a capacitor when a logic circuit module in a power-off state and a logic circuit module in a power-on state are adjacent to each other.
FIG. 1(B) is a diagram for describing the principle of an instantaneous voltage drop when the logic circuit module in the power-off state in the configuration of FIG. 1(A) transitions to the power-on state.

In the following description, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Further, though not particularly limited, circuit elements constituting each functional block in the embodiments are formed on a semiconductor substrate made of single crystalline silicon by the known integrated circuit technology of CMOS (Complementary Metal Oxide Semiconductor) transistor or the like.

Hereinafter, embodiments of this disclosure will be described in detail based on drawings. Also, in all the drawings for describing the embodiments, the same members are denoted by the same reference characters and the repetitive description thereof will be omitted. Furthermore, the dimensional ratios in the drawings are exaggerated for convenience of description and may differ from the actual ratios.

(Description of Principle of Instantaneous Voltage Drop In Process of Transitioning from Power-Off State to Power-on State by Single Power Supply)

FIG. 1(A) is a diagram showing in a simplified manner the principle of a relationship among electric charge, capacitor capacitance, and voltage applied to a capacitor when a logic circuit module in a power-off state and a logic circuit module in a power-on state are adjacent to each other.

A capacitor capacitance C1 indicates a parasitic capacitor capacitance of a circuit of a logic circuit module in a power-off state, and a capacitor capacitance Cp indicates a parasitic capacitor capacitance of a circuit of a logic circuit module in a power-on state. No voltage is supplied to the logic circuit module in the power-off state by the switch. Therefore, the charge accumulated in the logic circuit module in the power-off state is 0 coulomb (0c) as shown in FIG. 1(A). Since a voltage Vd is supplied from a regulator 10 via the switch to the logic circuit module in the power-off state, the electric charge accumulated in the logic circuit module in the power-on state is Qp coulomb as shown in FIG. 1(A). Therefore, the relationship of the following formula (1) holds for the logic circuit module in the power-on state.

$$Cp \times Vd = Qp \qquad (1)$$

FIG. 1(B) is a diagram for describing the principle of an instantaneous voltage drop when the logic circuit module in the power-off state in the configuration of FIG. 1(A) transitions to the power-on state. In FIG. 1(B), in order for the logic circuit module in the power-off state to transition to the power-on state, it is necessary to supply the voltage Vd from the regulator 10 to the logic circuit module in the power-off state via a switch, but when the switch is turned on, a part of the charge Qp is instantaneously supplied to the logic circuit module in the power-off state. This is because, when the voltage Vd decreases, the regulator 10 detects the decreased voltage value and then starts operating to maintain the voltage Vd, and thus there is a time lag from when the switch is turned on to when the operation starts, so that regulator 10 cannot instantaneously supply charge to C1. In addition, since VCL which is an external capacitor for stabilizing the power supply line is also arranged outside the semiconductor device, it is not possible to instantaneously supply electric charge to the logic circuit module in the power-off state due to the internal resistance and inductance of the semiconductor device.

As described above, given Vd' is the instantaneous transient voltage of the power supply line, Q1 is the charge supplied to the logic circuit module in the power-off state, and Qp' is the decreased charge of the logic circuit module in the power-on state, the following formulas (2) and (3) hold.

$$C1 \times Vd' = Q1 \qquad (2)$$

$$Cp \times Vd' = Qp' \qquad (3)$$

Also, the following formula (4) holds from the principle of charge conservation.

$$Qp = Q1 + Qp' \qquad (4)$$

Substituting formula (1), formula (2), and formula (3) into formula (4) gives $$Cp \times Vd = C1 \times Vd' + Cp \times Vd' = (C1 + Cp) \times Vd'$$

When the above equation is solved for Vd', $$Vd' = (Cp/(C1+Cp)) \times Vd = ((1/(1+(C1/Cp))) \cdot Vd$$

holds.

That is, it can be seen that the voltage Vd' becomes smaller (the voltage drop of the voltage Vd becomes larger) as (C1/Cp) becomes larger.

For example, if the logic circuit module in the power-off state and the logic circuit module in the power-on state have the same capacitor capacitance (including parasitic capacitance, etc.), the voltage Vd' is half the voltage Vd, which may cause the malfunction of the logic circuit module in the power-on state, and it is thus difficult to increase the scale of the logic circuit module in the power-off state.

In order to increase the scale of the logic circuit modules that can be put into the power-off state, as will be described later, it is conceivable to divide the logic circuit module in the power-off state such that the divided logic circuit modules are brought into the power-on state by time division. However, in this case, the standby recovery time required for transitioning from the power-off state to the power-on state becomes long due to the number of divisions by the time division.

First Embodiment

<Description of Configuration and Active Mode of Semiconductor Device 1000>

Figure 2:
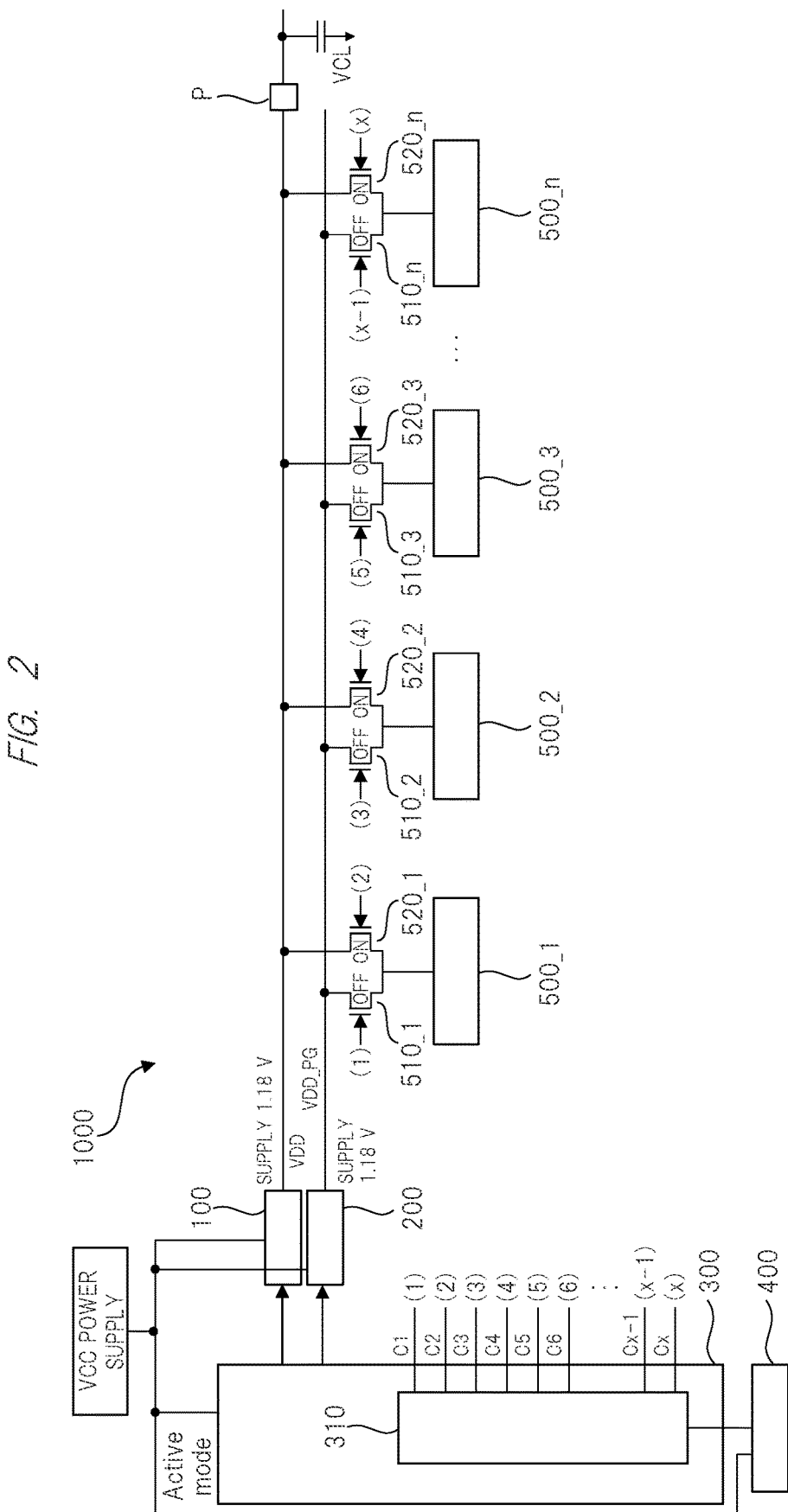
FIG. 2 is a block diagram showing an example of the configuration and operating state of a semiconductor device according to the first embodiment in the Active mode (active mode).

FIG. 2 is a block diagram showing an example of the configuration and operating state of a semiconductor device 1000 according to the first embodiment in the Active mode. The semiconductor device 1000 according to the first embodiment includes a first regulator 100, a second regulator 200, a control circuit 300, and a setting register 400. Furthermore, the semiconductor device 1000 according to the first embodiment includes a plurality of functional circuit modules (500_1, 500_2, 500_3, . . . 500_n (n is a natural number of 4 or more)) and a plurality of switch circuits (510_1, 510_2, 510_3, . . . 510_n, 520_1, 520_2, 520_3, . . . 520_n (n is a natural number of 4 or more)).

The first regulator 100 regulates the voltage supplied from outside to generate the voltage VDD to be supplied as the specified voltage of the functional circuit module. For example, the voltage VCC supplied from outside to the first regulator 100 may be 3.3 volts, and the voltage VDD output from the first regulator 100 may be approximately 1.18 volts. The voltage VDD output from the first regulator 100 needs to be equal to or higher than the voltage (operation guarantee voltage) that guarantees the operation of the functional circuit module. Note that the first regulator 100 supplies the current required by the functional circuit modules. For example, the supply current of the first regulator 100 differs between when all the functional circuit modules of the semiconductor device are in a power-on state and when the semiconductor device partially includes the logic circuit modules in a power-off state. Also, in the vicinity of a pad P located at an output end of a first power supply line, which is the output line of the first regulator 100, from the semiconductor device 1000, a stabilizing capacitor VCL for stabilizing the voltage of a power supply line is electrically connected to the power supply line. Also, since FIG. 2 shows the semiconductor device 1000 in the Active mode, the voltage VDD generated by the first regulator 100 is supplied to all the functional circuit modules.

The second regulator 200 regulates the voltage supplied from outside to generate the voltage VDD_PG to be supplied as the specified voltage of the functional circuit module. The voltage VDD and the voltage VDD_PG are preferably the same. However, the voltage VDD_PG output from the second regulator 200 also needs to be equal to or higher than the voltage (operation guarantee voltage) that guarantees the operation of the functional circuit module. For example, the voltage VCC supplied from outside to the second regulator 200 may be 3.3 volts, and the voltage VDD_PG output from the second regulator 200 may be approximately 1.18 volts. The voltage VDD_PG is supplied to the functional circuit modules by a second power supply line, which is the output line of the second regulator 200. Note that the stabilizing capacitor similar to that electrically connected to the first power supply line is not electrically connected to the second power supply line. Also, the second power supply line of the second regulator 200 and the first power supply line of the first regulator 100 are independent power supply lines in the STBY mode. Furthermore, since FIG. 2 shows the semiconductor device 1000 in the Active mode, the voltage VDD_PG generated by the second regulator 200 is not supplied to any of the functional circuit modules.

The control circuit 300 operates with the voltage VCC supplied from outside and controls the first regulator 100 and the second regulator 200 described above. Also, the control circuit 300 includes a switch control unit 310.

The switch control unit 310 includes control lines for performing the ON/OFF control of the plurality of switch circuits (510_1, 510_2, 510_3, . . . 510_n, 520_1, 520_2, 520_3, . . . 520_n (n is a natural number of 4 or more)). For example, the control line C1 performs the ON/OFF control of the switch circuit 510_1. When the switch circuit 510_1 is turned on, the functional circuit module 500_1 is electrically connected to the output of the second regulator 200 and supplied with the voltage VDD_PG. Further, when the switch circuit 510_1 is turned off, the functional circuit module 500_1 and the output of the second regulator 200 are electrically disconnected. Also, the control line C2 performs the ON/OFF control of the switch circuit 520_1. When the switch circuit 520_1 is turned on, the functional circuit module 500_1 is electrically connected to the output of the first regulator 100 and supplied with the voltage VDD. Further, when the switch circuit 520_1 is turned off, the functional circuit module 500_1 and the output of the first regulator 100 are electrically disconnected.

As described above, the switch control unit 310 includes the control lines for performing the ON/OFF control of the electrical connection between each functional circuit module and the first regulator 100 and the second regulator 200. As an example, in FIG. 2, the control lines for controlling the switch circuits twice as many as the number of functional circuit modules are provided. However, it is also possible for the switch control unit 310 to perform the ON/OFF control of the switch circuits by using a decoder or the like (not shown).

In FIG. 2, the control line C3 performs the ON/OFF control of the switch circuit 510_2, and the control line C4 performs the ON/OFF control of the switch circuit 520_2. Also, the control line C5 performs the ON/OFF control of the switch circuit 510_3, and the control line C6 performs the ON/OFF control of the switch circuit 520_3. Further, the control line Cx−1 performs the ON/OFF control of the switch circuit 510_n, and the control line Cx performs the ON/OFF control of the switch circuit 520_n. As described above, the number of switch circuits is twice the number of functional circuit modules.

Identification information of the switch circuits to be turned on and the switch circuits to be turned off in the STBY mode is written in the setting register 400. Therefore, the switch control unit 310 reads out the identification information of the setting register 400, identifies the switch circuits to be turned on and the switch circuits to be turned off in the STBY mode, and determines the logic level of the control lines. Note that the technique related to the writing of identification information and the switching between the Active mode and the STBY mode belongs to conventional art, so details thereof will be omitted in the embodiment of this disclosure.

The switch circuits (510_1, 510_2, 510_3, . . . 510_n, 520_1, 520_2, 520_3, . . . 520_n (n is a natural number of 4 or more)) can be semiconductor switches such as bipolar transistors or field effect transistors. The switch circuits 520_1, 520_2, 520_3, . . . 520_n are collectively referred to as first switch circuits in some cases. The switch circuits 510_1, 510_2, 510_3, . . . 510_n are collectively referred to as second switch circuits in some cases. The first switch circuit has a function of electrically connecting and disconnecting the first power supply line of the first regulator and the functional circuit module. Also, the second switch circuit has a function of electrically connecting and disconnecting the second power supply line of the second regulator and the functional circuit module. In the case of the Active mode, all the first switch circuits are in the ON state and all the second switch circuits are in the OFF state.

The functional circuit modules (500_1, 500_2, 500_3, . . . 500_n (n is a natural number of 4 or more)) can be IP (Intellectual Property). Namely, the functional circuit module can be a circuit module having some function, a circuit module having a part of some function, or a circuit module having multiple functions. For example, one functional circuit module can be a circuit module such as a CPU, a part of a CPU, at least part of a memory circuit, multiple CPUs, multiple storage units, or a timer. Moreover, at least two functional circuit modules are provided in the semiconductor device 1000 according to the present embodiment.

In FIG. 2, all the functional circuit modules 500_1, 500_2, 500_3, and 500_n are electrically connected to the output of the first regulator 100 via switch circuits. Therefore, all the functional circuit modules are in the power-on state and operable. Note that the functional circuit module whose operation is suspended during the STBY mode may be referred to as a standby mode operation suspension module. Also, the functional circuit module whose operation is not suspended even in the STBY mode may be referred to as a standby mode operation continuation module.

<Description of STBY Mode of Semiconductor Device 1000>

Figure 3:
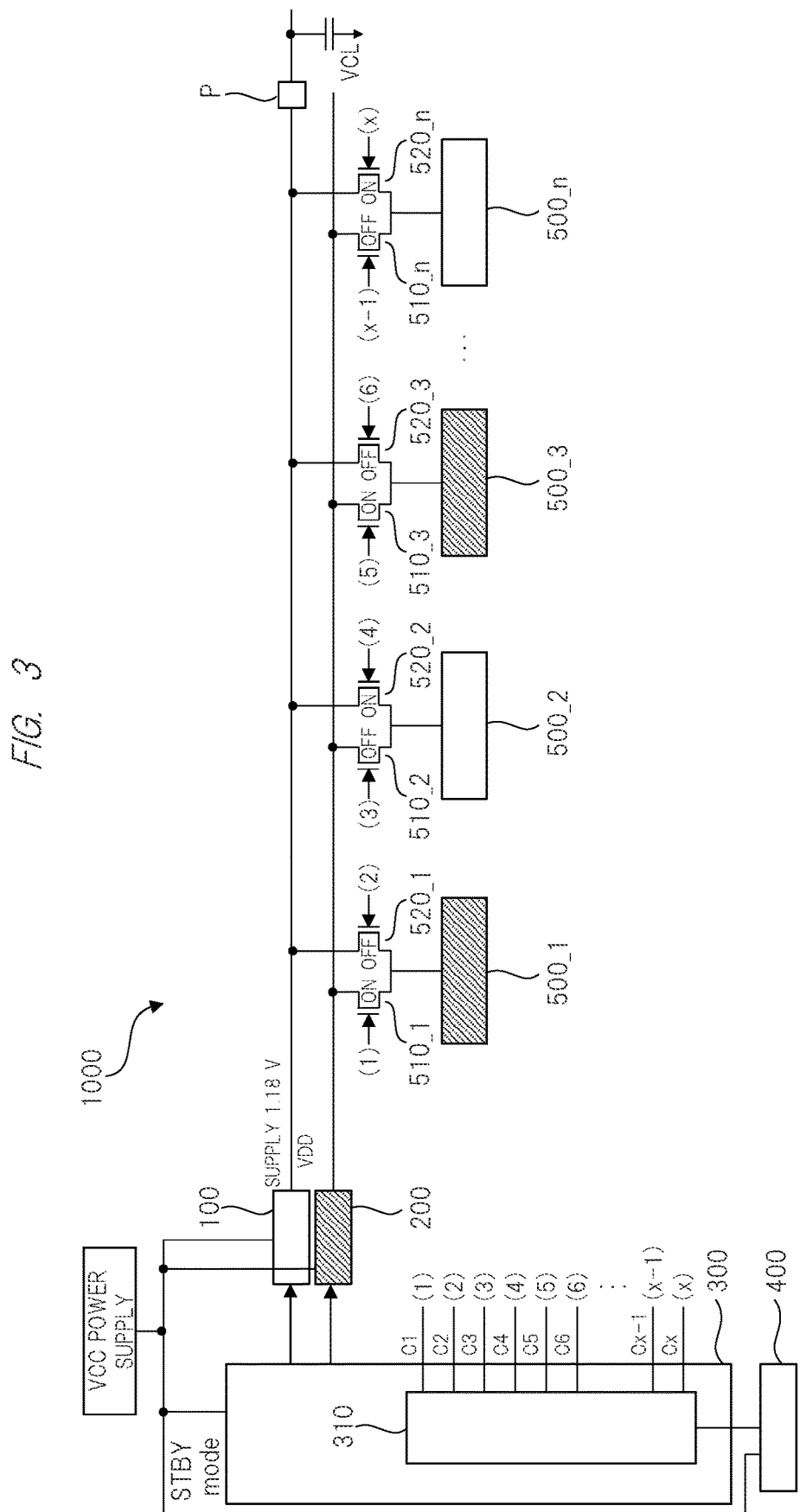
FIG. 3 is a block diagram showing an example of the configuration and operating state of the semiconductor device according to the first embodiment in the STBY mode (standby mode).

FIG. 3 is a block diagram showing an example of the configuration and operating state of the semiconductor device 1000 according to the first embodiment in the STBY mode. The semiconductor device 1000 according to the first embodiment includes the first regulator 100, the second regulator 200, the control circuit 300, and the setting register 400 as described above. Furthermore, as described above, the semiconductor device according to the first embodiment includes a plurality of functional circuit modules (500_1, 500_2, 500_3, . . . 500_n (n is a natural number of 4 or more)) and a plurality of switch circuits (510_1, 510_2, 510_3, . . . 510_n, 520_1, 520_2, 520_3, . . . 520_n (n is a natural number of 4 or more)).

Also, as shown in FIG. 3, the semiconductor device 1000 according to the first embodiment in the STBY mode includes one or more functional circuit modules to be in the power-off state. For example, since no voltage is supplied to the functional circuit modules 500_1 and 500_3 from the first regulator 100 and the second regulator 200 in FIG. 3, the functional circuit modules 500_1 and 500_3 are in the power-off state. In the STBY mode, the second power supply line, which is the output line of the second regulator 200, is at 0 volts or in a high impedance state.

Furthermore, as shown in FIG. 3, in the semiconductor device 1000 according to the first embodiment in the STBY mode, the second switch circuits of the functional circuit modules 500_1 and 500_3 in the power-off state are turned on. This is to quickly recover the functional circuit modules 500_1 and 500_3 in the power-off state to the Active mode. Also, the second switch circuits of the functional circuit modules 500_2 and 500_n in the power-on state are turned off. However, since the first switch circuits of the functional circuit modules 500_2 and 500_n are in the ON state, the voltage VDD is supplied to the functional circuit modules 500_2 and 500_n from the first regulator 100, and the functional circuit modules 500_2 and 500_n maintain the power-on state.

<Transition of Semiconductor Device 1000 from Active Mode To STBY Mode>

Figures 4A, 4B, 4C:
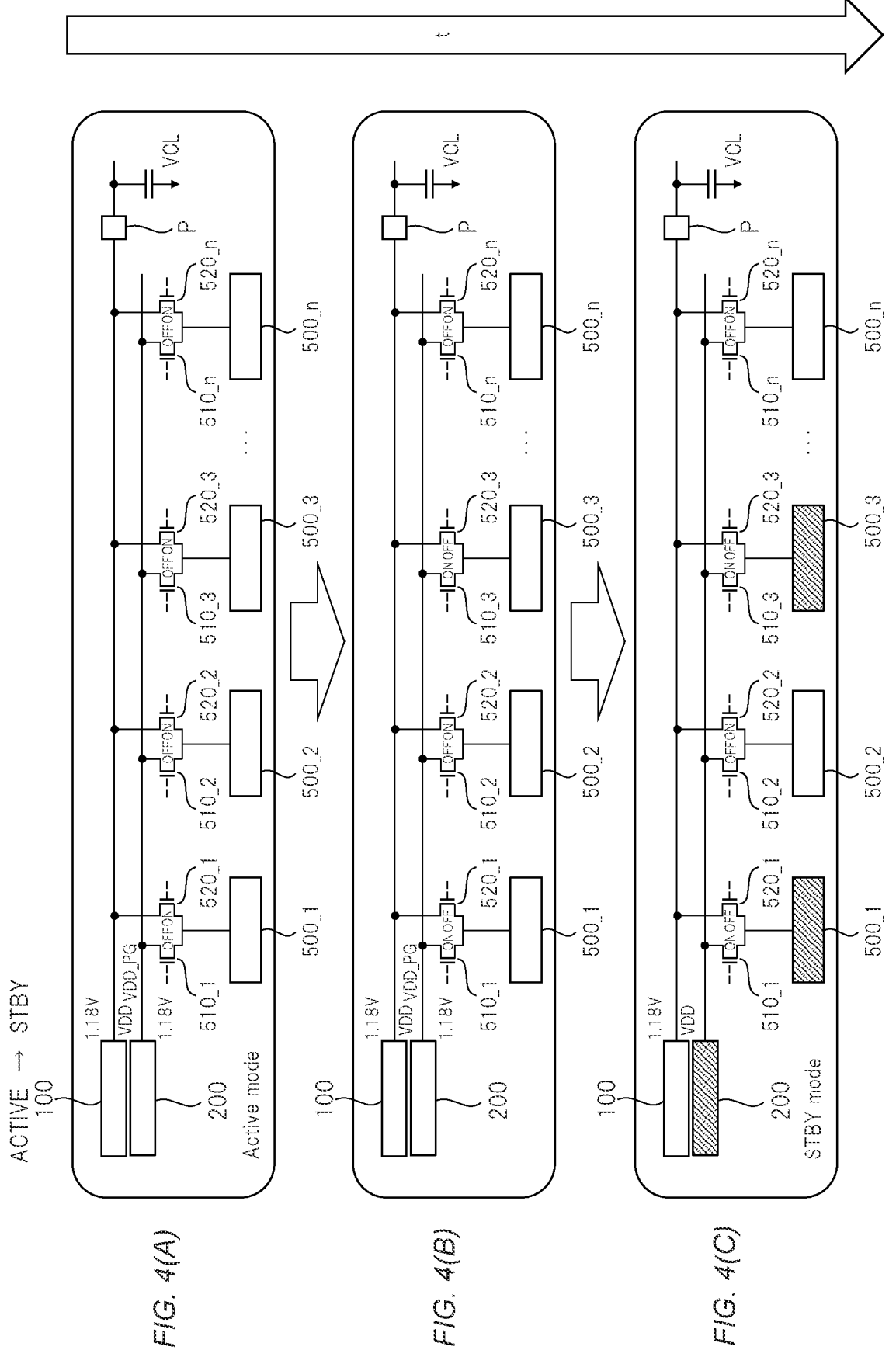
FIG. 4(A) is a block diagram showing in a simplified manner an example of the configuration and operating state of the semiconductor device according to the first embodiment in the Active mode.
FIG. 4(B) is a block diagram showing in a simplified manner an example of the operation during the transition of the semiconductor device according to the first embodiment from the Active mode to the STBY mode.
FIG. 4(C) is a block diagram showing in a simplified manner an example of the configuration and operating state of the semiconductor device according to the first embodiment in the STBY mode.

FIG. 4(A) to FIG. 4(C) are block diagrams illustrating the process of the semiconductor device 1000 transitioning from the Active mode to the STBY mode along with elapsed time. FIG. 4(A) is a block diagram showing the case where the semiconductor device 1000 is in the Active mode in a simplified manner. FIG. 4(B) is a block diagram showing in a simplified manner the operation during the transition of the semiconductor device 1000 from the Active mode to the STBY mode. FIG. 4(C) is a block diagram showing the case where the semiconductor device 1000 is in the STBY mode in a simplified manner. Since FIG. 4(A) shows a part of FIG. 2, detailed description thereof will be omitted. Also, since FIG. 4(C) shows a part of FIG. 3, detailed description thereof will be omitted.

When the semiconductor device 1000 is in the Active mode, the voltage VDD is supplied to the functional circuit modules included in the semiconductor device 1000 from the first regulator via the first power supply line as shown in FIG. 4(A). Also, the functional circuit modules included in the semiconductor device 1000 do not receive the supply of the voltage VDD_PG from the second regulator via the second power supply line. Namely, the second switch circuits are turned off, and the first switch circuits are turned on.

In the transition process in which the semiconductor device 1000 transitions from the Active mode to the STBY mode, the semiconductor device 1000 operates as shown in FIG. 4(B). More specifically, the second switch circuit of the functional circuit module transitioning from the Active mode to the STBY mode changes from the OFF state to the ON state, and the first switch circuit thereof changes from the ON state to the OFF state. In this state, the functional circuit module that transitions from the power-on state to the power-off state also maintains the power-on state.

As shown in FIG. 4(C), when the semiconductor device 1000 transitions from the transition process shown in FIG. 4(B) to the STBY mode, the output voltage of the second regulator becomes 0 volts or the output of the second regulator becomes high impedance. Therefore, the functional circuit module electrically connected to the second switch circuit in the ON state transitions to the power-off state. In the case of FIG. 4(C), the functional circuit modules 500_1 and 500_3 transition to the power-off state.

<Transition of Semiconductor Device 1000 from STBY Mode to Active Mode>

Figures 5A, 5B, 5C:
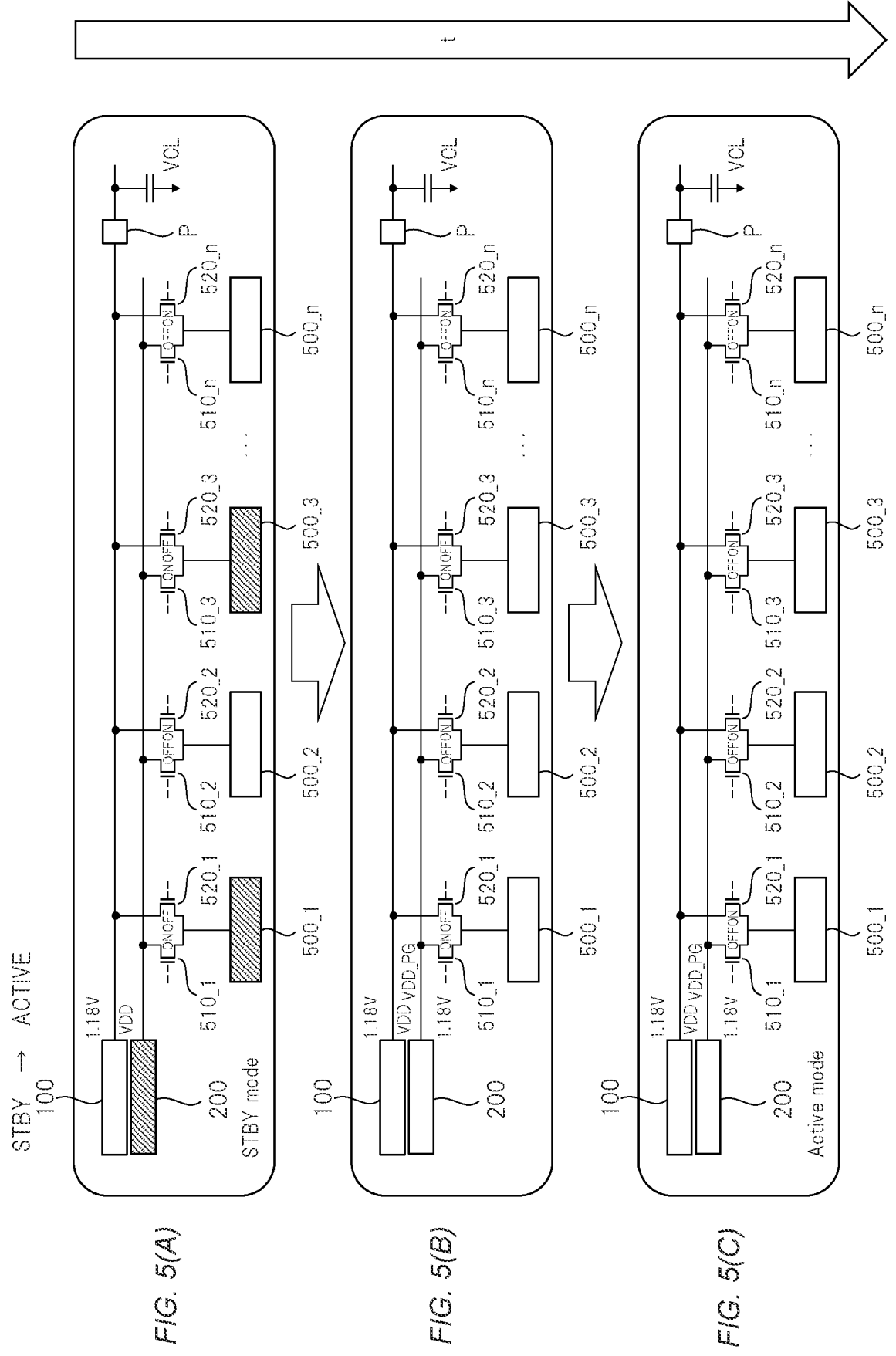
FIG. 5(A) is a block diagram showing in a simplified manner an example of the configuration and operating state of the semiconductor device according to the first embodiment in the STBY mode.
FIG. 5(B) is a block diagram showing in a simplified manner an example of the operation during the transition of the semiconductor device according to the first embodiment from the STBY mode to the Active mode.
FIG. 5(C) is a block diagram showing in a simplified manner an example of the configuration and operating state of the semiconductor device according to the first embodiment in the Active mode.

FIG. 5(A) to FIG. 5(C) are block diagrams illustrating the process of the semiconductor device 1000 transitioning from the STBY mode to the Active mode along with elapsed time. FIG. 5(A) is a block diagram showing the case where the semiconductor device 1000 is in the STBY mode in a simplified manner. FIG. 5(B) is a block diagram showing in a simplified manner the operation during the transition of the semiconductor device 1000 from the STBY mode to the Active mode. FIG. 5(C) is a block diagram showing the case where the semiconductor device 1000 is in the Active mode in a simplified manner. FIG. shows the same state as that in FIG. 4(C) in which the semiconductor device 1000 is in the STBY mode. FIG. 5(B) shows the same state as that of the semiconductor device 1000 in FIG. 4(B). FIG. 5(C) shows the same state as that in FIG. 4(A) in which the semiconductor device 1000 is in the Active mode.

In the functional circuit modules in the power-off state in FIG. 5(A), the second switch circuits are in the ON state. In FIG. 5(B), when the second regulator starts outputting voltage, the functional circuit modules electrically connected to the second switch circuits in the ON state are charged up from the power-off state (0 volts) to the voltage VDD_PG. In this case, the output voltage of the second regulator changes from the initial voltage to the voltage VDD_PG. At this time, the voltage drop described with reference to FIG. 1(B) does not occur in the functional circuit modules that do not suspend operation even in the STBY mode such as the functional circuit modules 500_2 and 500_n. This is because the functional circuit modules 500_2 and 500_n are electrically isolated from the voltage VDD_PG. Also, during the rise time when the output voltage of the second regulator changes from the initial voltage to the voltage VDD_PG, all the functional circuit modules electrically connected to the second switch circuits in the ON state are charged up from the power-off state (0 volts) to the voltage VDD_PG.

In FIG. 5(C), the functional circuit module charged up to the voltage VDD_PG turns on the first switch circuit and then turns off the second switch circuit, thereby setting the voltage VDD supplied from the first regulator as the power supply voltage. If the voltage VDD_PG and the voltage VDD are the same voltage, the drop of the power supply voltage supplied to the functional circuit module does not occur at the switching of the switch circuit.

Figures 6A, 6B:
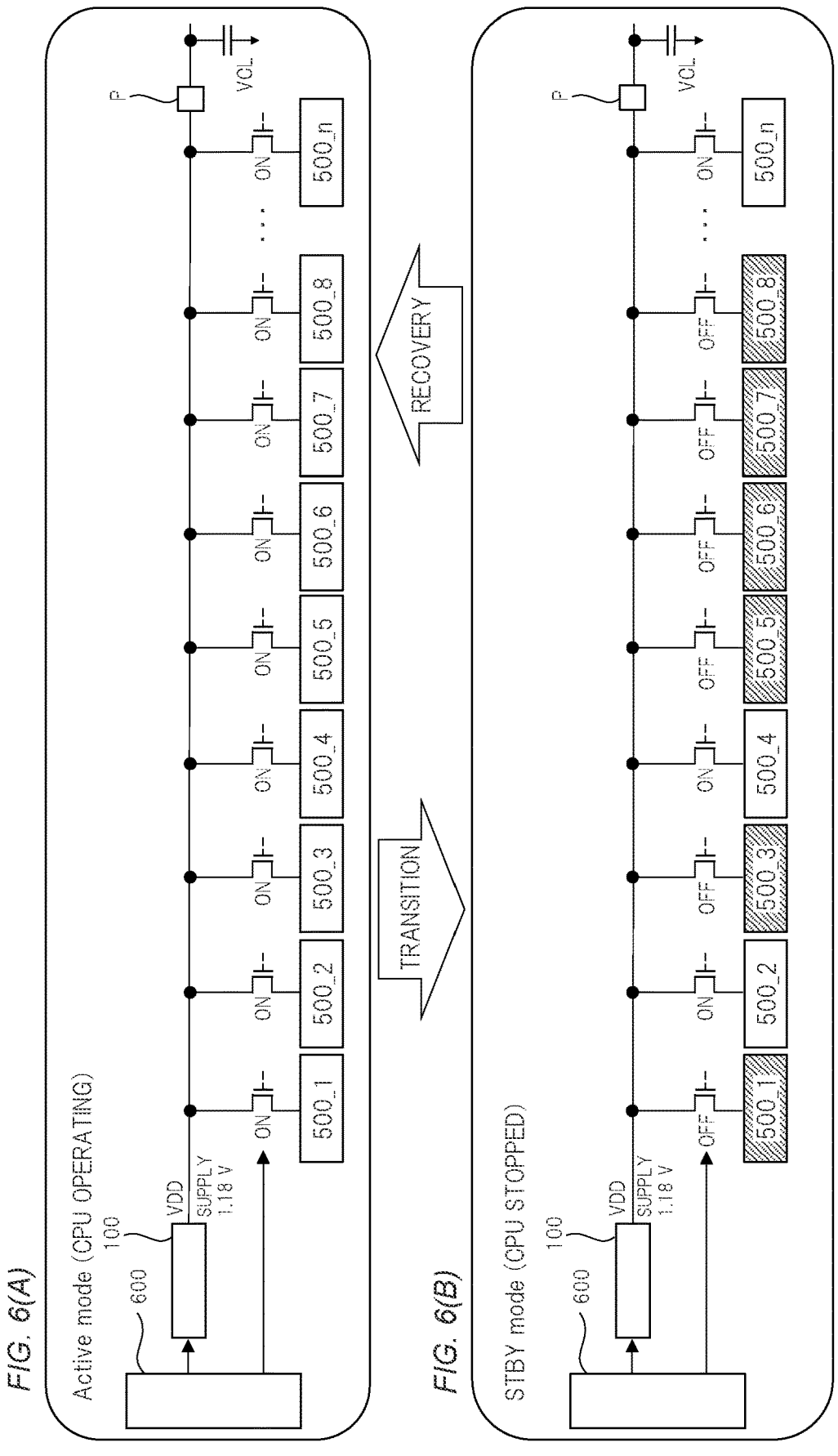
FIG. 6(A) is a block diagram showing an example of the configuration and operating state of a semiconductor device according to a comparative example in the Active mode.
FIG. 6(B) is a block diagram showing an example of the configuration and operating state of the semiconductor device according to the comparative example in the STBY mode.

FIG. 6(A) is a block diagram showing a state in which the entire chip is maintained in the Active mode by using a conventional single power supply. Namely, the CPU is operating and the entire chip is operating. Therefore, the functional circuit modules 500_1 to 500_8 and 500_n are supplied with the voltage VDD (1.18 V) from the first regulator 100 via the switch circuit, and are in an operable state.

FIG. 6(B) is a block diagram showing an example of a state in which the entire chip is maintained in the STBY mode by using a conventional single power supply. Namely, although the CPU is stopped, the voltage VDD (1.18 V) is supplied via a switch circuit from the first regulator 100 to a functional circuit module such as a timer that needs to operate continuously or a functional circuit module such as a memory that needs to hold information continuously. As an example, FIG. 6(B) shows the state in which the voltage VDD (1.18 V) is supplied to the functional circuit modules 500_2, 500_4, and 500_n, and the voltage VDD (1.18 V) is not supplied to the functional circuit modules 500_1, 500_3, 500_5 to 500_8, and the like.

Figure 7:
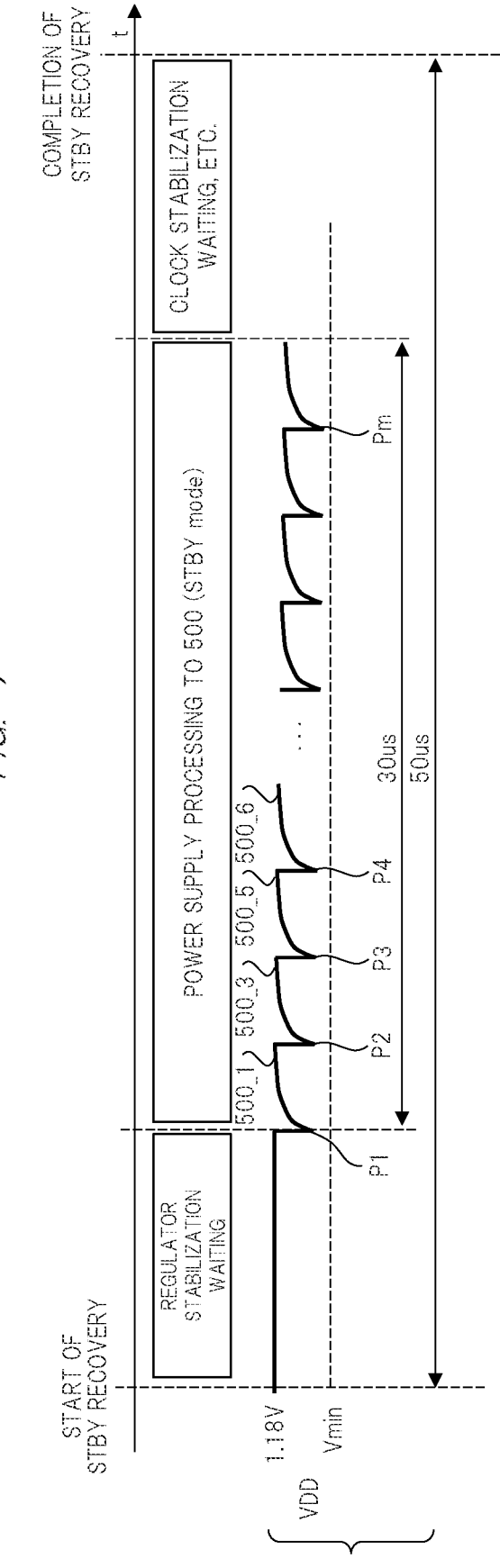
FIG. 7 is a diagram showing in a simplified manner an example of changes in potential and state on the time axis when the semiconductor device according to the comparative example transitions from the STBY mode to the Active mode.

FIG. 7 is a timing chart showing the operation in which the entire chip transitions from the STBY mode to the Active mode by using a conventional single power supply. In FIG. 7, in order to suppress the voltage drop described with reference to FIG. 1(B), a plurality of functional modules transition from the power-off state to the power-on state in a time-division manner. The reason for employing the time division is that the voltage drop will be too large if all the functional modules transition from the power-off state to the power-on state at once. For example, when only the first regulator is used as a single power supply to cause the entire chip to transition from the STBY mode to the Active mode, the voltage drop described with reference to FIG. 1(B) occurs. Namely, it is necessary that the minimum voltage values P1, P2, P3, and others of the voltage supplied to the functional circuit modules shown in FIG. 7 do not fall below the lower limit voltage Vmin at which the functional circuit modules can normally operate, due to the voltage drop. This is because, if the minimum voltage value of the voltage supplied to the functional circuit modules falls below the lower limit voltage Vmin, the functional circuit modules operating in the power-on state will not operate normally. Therefore, it is necessary to sequentially charge up the divided functional circuit modules such that the minimum voltage value of the voltage supplied to the functional circuit modules does not fall below the lower limit voltage Vmin. For this reason, the time for transitioning from the STBY mode to the Active mode (standby recovery time) is lengthened in accordance with the number of divided functional circuit modules.

Specifically, in the experimental example of FIG. 7, it took approximately 50 μs for the stabilization waiting time of the regulator (first regulator), the processing time for sequentially supplying the power supply voltage to the plurality of functional circuit modules in the power-off state, and the time for the stabilization of the clock of the semiconductor device 1000. The regulator stabilization waiting time is the time required to increase the supply power of the regulator. Also, the clock stabilization waiting time is the time including the settling time of the clock of the semiconductor device 1000 and the like. The operation of FIG. 7 will be described in order with reference to FIG. 8(A) to FIG. 11(B).

FIG. 8(A) is a diagram showing the state of the chip in the period from the start of the operation to cause the entire chip to transition from the STBY mode to the Active mode until the end of the "regulator stabilization waiting" time in FIG. 7. Namely, the state of FIG. 8(A) is maintained until the current supply capability of the regulator 100 to the entire chip is stabilized. For the purpose of low power consumption, the current driving capability of the regulator is lowered in the STBY state in general. Therefore, when changing from the STBY mode to the Active mode, the regulator needs to be changed to a high drive state at the beginning. Here, this waiting time for changing the regulator from the low drive state to the high drive state is referred to as "regulator stabilization waiting" time.

FIG. 8(B) is a block diagram showing the state in which the switch circuit of the functional circuit module 500_1 is turned on after the end of the "regulator stabilization waiting" time in FIG. 8(A) and the voltage VDD (1.18 V) is supplied to the functional circuit module 500_1. In this case, the voltage VDD drops to the voltage P1 in FIG. 7 as described with reference to FIG. 1(B). As described above, it is necessary to limit the module scale of the functional circuit module 500_1 such that the voltage P1 does not fall below the lower limit voltage Vmin. After a while after the switch circuit of the functional circuit module 500_1 is turned on, the voltage VDD supplied to the functional circuit module 500_1 recovers to approximately 1.18 volts as shown in FIG. 7.

Figures 9A, 9B:
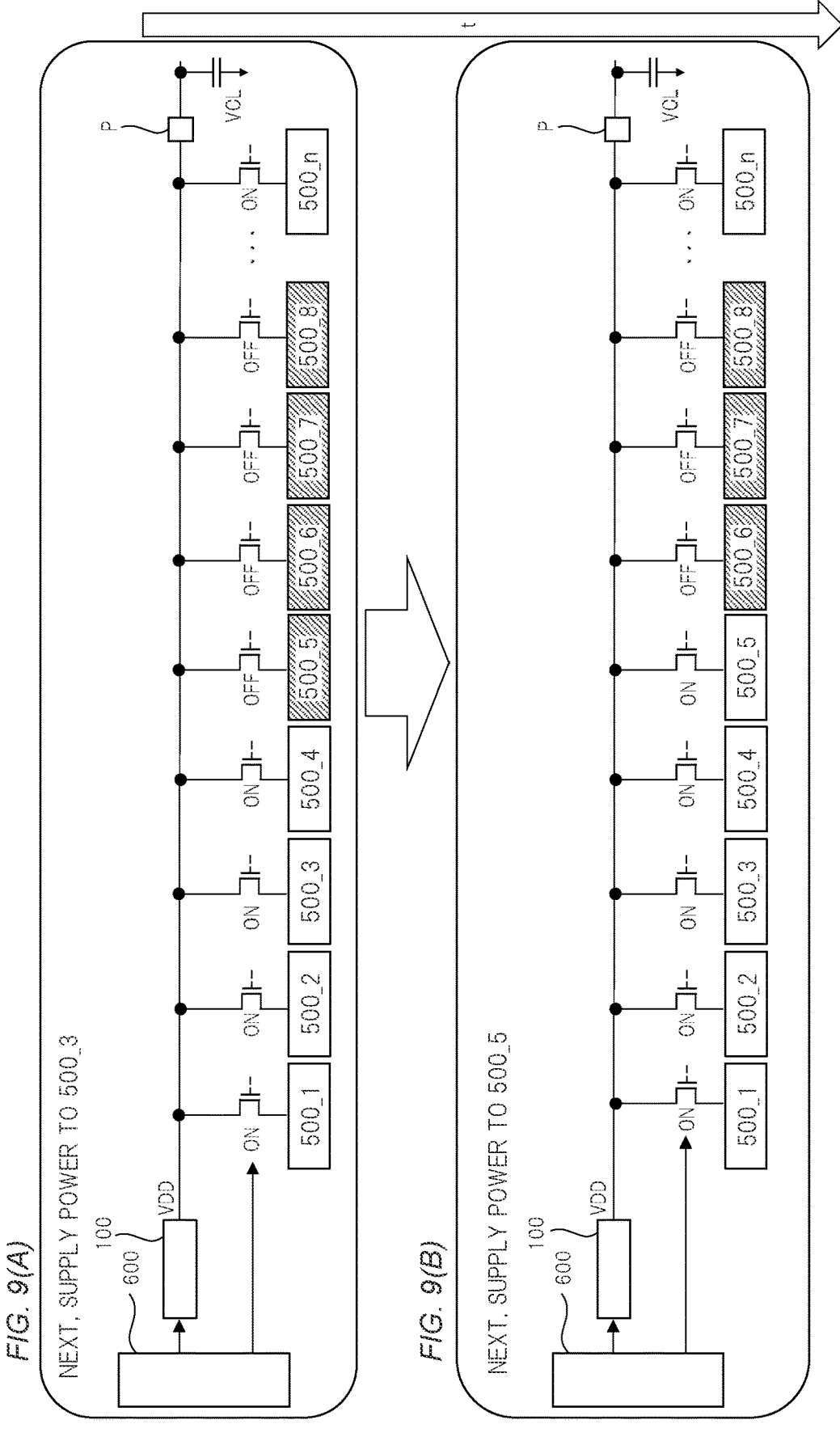
FIG. 9(A) is a block diagram for describing an example of the configuration and operating state when power is supplied to a functional circuit module 500_3 of the semiconductor device according to the comparative example in FIG. 8(B).
FIG. 9(B) is a block diagram for describing an example of the configuration and operating state when power is supplied to a functional circuit module 500_5 of the semiconductor device according to the comparative example in FIG. 9(A).
Figure 12:
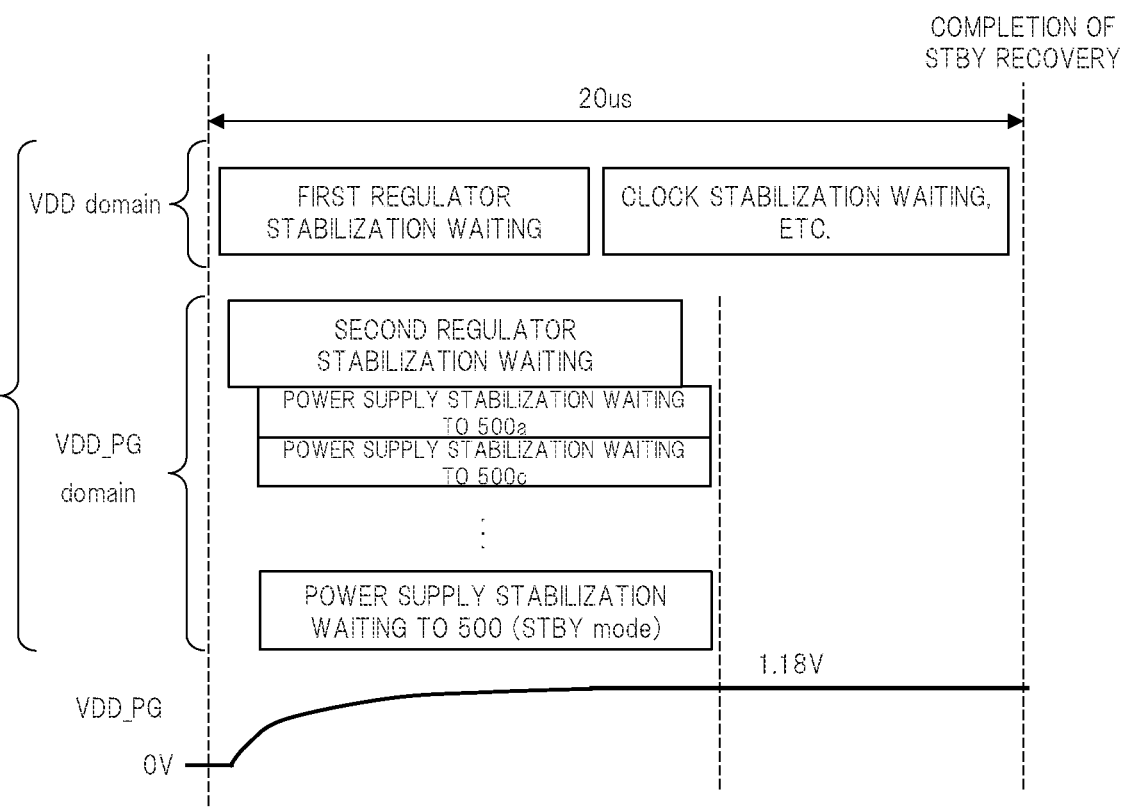
FIG. 12 is a diagram showing in a simplified manner an example of changes in potential and state on the time axis when the semiconductor device according to the first embodiment transitions from the STBY mode to the Active mode.

FIG. 9(A) is a block diagram showing the state in which the switch circuit of the functional circuit module 500_3 is turned on after the voltage VDD supplied to the functional circuit module 500_1 recovers to approximately 1.18 volts in FIG. 8(B), and the voltage VDD (1.18 V) is supplied to the functional circuit module 500_3. Also in this case, the voltage VDD drops to the voltage P2 in FIG. 7 as described with reference to FIG. 1(B). As described above, it is necessary to limit the module scale of the functional circuit module 500_3 such that the voltage P2 also does not fall below the lower limit voltage Vmin. After a while after the switch circuit of the functional circuit module 500_3 is turned on, the voltage VDD supplied to the functional circuit module 500_3 recovers to approximately 1.18 volts as shown in FIG. 7.

Similarly, FIG. 9(B) is a block diagram showing the state in which the switch circuit of the functional circuit module 500_5 is turned on after the voltage VDD supplied to the functional circuit module 500_3 recovers to approximately 1.18 volts in FIG. 9(A), and the voltage VDD (1.18 V) is supplied to the functional circuit module 500_5. Also in this case, the voltage VDD drops to the voltage P3 in FIG. 7 as described with reference to FIG. 1(B). As described above, it is necessary to limit the module scale of the functional circuit module 500_5 such that the voltage P3 also does not fall below the lower limit voltage Vmin. After a while after the switch circuit of the functional circuit module 500_5 is turned on, the voltage VDD supplied to the functional circuit module 500_5 recovers to approximately 1.18 volts as shown in FIG. 7.

Similarly to FIG. 9(B), FIG. 10(A) is a block diagram showing the state in which the switch circuit of the functional circuit module 500_6 is turned on after the voltage VDD supplied to the functional circuit module 500_5 recovers to approximately 1.18 volts in FIG. 9(B), and the voltage VDD (1.18 V) is supplied to the functional circuit module 500_6. Also in this case, the voltage VDD drops to the voltage P4 in FIG. 7 as described with reference to FIG. 1(B). As described above, it is necessary to limit the module scale of the functional circuit module 500_6 such that the voltage P4 also does not fall below the lower limit voltage Vmin. After a while after the switch circuit of the functional circuit module 500_6 is turned on, the voltage VDD supplied to the functional circuit module 500_6 recovers to approximately 1.18 volts as shown in FIG. 7.

Further, similarly to FIG. 10(A), FIG. 10(B) is a block diagram showing the state in which the switch circuit of the functional circuit module 500_7 is turned on after the voltage VDD supplied to the functional circuit module 500_6 recovers to approximately 1.18 volts in FIG. 10(A), and the voltage VDD (1.18 V) is supplied to the functional circuit module 500_7. Also in this case, the voltage VDD drops as described with reference to FIG. 1(B), and it is necessary to limit the module scale of the functional circuit module 500_7 such that the dropped voltage value does not fall below the lower limit voltage Vmin as described above. After a while after the switch circuit of the functional circuit module 500_7 is turned on, the voltage VDD supplied to the functional circuit module 500_7 recovers to approximately 1.18 volts.

Furthermore, similarly to FIG. 10(B), FIG. 11(A) is a block diagram showing the state in which the switch circuit of the functional circuit module 500_8 is turned on after the voltage VDD supplied to the functional circuit module 500_7 recovers to approximately 1.18 volts in FIG. 10(B), and the voltage VDD (1.18 V) is supplied to the functional circuit module 500_8. Also in this case, the voltage VDD drops as described with reference to FIG. 1(B), and it is necessary to limit the module scale of the functional circuit module 500_8 such that the dropped voltage value does not fall below the lower limit voltage Vmin as described above. After a while after the switch circuit of the functional circuit module 500_8 is turned on, the voltage VDD supplied to the functional circuit module 500_8 recovers to approximately 1.18 volts.

FIG. 11(B) is a block diagram showing the state in which, after the voltage VDD supplied to the functional circuit module 500_8 recovers to approximately 1.18 volts in FIG.

11(A), the switch circuits of the other functional circuit modules in the power-off state are sequentially turned on by the above-described procedure, and then the clock stabilization waiting, etc. in FIG. 7 are executed, so that the standby recovery is completed.

In contrast with the operation in which the entire chip transitions from the STBY mode to the Active mode by using a conventional single power supply in FIG. 6(A) to FIG. 11(B), FIG. 12 is a timing chart showing the operation in which the functional circuit module of the semiconductor device 1000 according to the present embodiment transitions from the STBY mode to the Active mode. As described in the process of transitioning from the STBY mode to the Active mode with reference to FIG. 5(A) to FIG. 5(C), the voltage VDD_PG can be applied simultaneously to all the functional circuit modules that are in the power-off state during the STBY mode. Therefore, the processing time (approximately 30 μs) required to sequentially supply the power supply voltage to the plurality of functional circuit modules in the power-off state shown in FIG. 6(A) is significantly reduced. In the experimental example of FIG. 12, the functional circuit module can transition from the power-off state to the power-on state within approximately 20 μs corresponding to the total of the stabilization waiting time of the first regulator 100 and the time until the clock of the semiconductor device 1000 is stabilized. More specifically, the semiconductor device 1000 according to the present embodiment can halve the time required to cause the MCU to transition from the STBY mode to the Active mode, as compared with the conventional experimental example shown in FIG. 6(A).

As described above, with the configuration and operation according to the present embodiment, it is possible to provide a semiconductor device capable of shortening the standby recovery time for transitioning from the STBY mode to the Active mode.

Second Embodiment

<Description of Configuration and Active Mode of Semiconductor Device 1000'>

Figure 13:
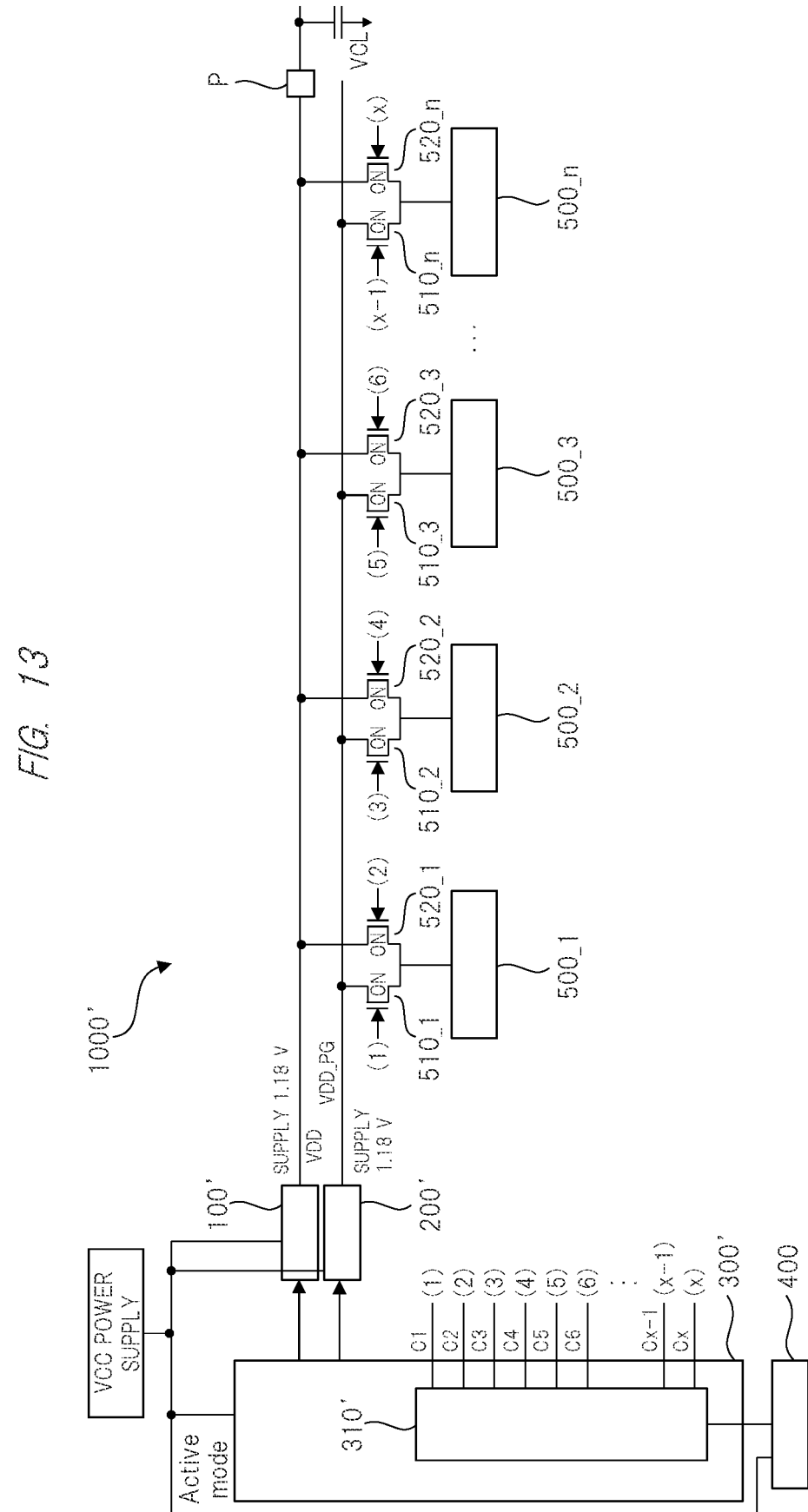
FIG. 13 is a block diagram showing an example of the configuration and operating state of a semiconductor device according to the second embodiment in the Active mode.

FIG. 13 is a block diagram showing an example of the configuration and operating state of a semiconductor device 1000' according to the second embodiment in the Active mode. The semiconductor device 1000' according to the second embodiment includes a first regulator 100', a second regulator 200', a control circuit 300', and a setting register 400. Furthermore, the semiconductor device 1000' according to the second embodiment includes a plurality of functional circuit modules (500_1, 500_2, 500_3, . . . 500_n (n is a natural number of 4 or more)) and a plurality of switch circuits (510_1, 510_2, 510_3, . . . 510_n, 520_1, 520_2, 520_3, . . . 520_n (n is a natural number of 4 or more)). The plurality of functional circuit modules and the plurality of switch circuits of the semiconductor device 1000' according to the second embodiment may be the same as the plurality of functional circuit modules and the plurality of switch circuits of the semiconductor device 1000 according to the first embodiment. However, the operation of the plurality of switch circuits according to the second embodiment is partially different from the operation of the plurality of switch circuits according to the first embodiment.

Specifically, when the functional circuit module according to the second embodiment is in the Active mode, both the first switch circuit and the second switch circuit are turned on. Namely, when the functional circuit module is in the Active mode, the power supply voltage can be supplied from both the first regulator 100' and the second regulator 200'. Therefore, the power supplied to the functional circuit module can be supplemented by both the first regulator 100' and the second regulator 200'. The second regulator 200 according to the first embodiment functions as a dedicated regulator for transitioning from the STBY mode to the Active mode. As a result, the mounting area for the second regulator 200 increases, resulting in area overhead. However, the second regulator 200' according to the second embodiment can be configured to supplement the power supply of the first regulator 100'. Therefore, the combined mounting area of the first regulator 100' and the second regulator 200' according to the second embodiment is equal to the mounting area of the first regulator 100 according to the first embodiment. Namely, the mounting area of the regulator according to the second embodiment can be reduced by the area of the regulator 200 according to the first embodiment as compared with the mounting area of the regulator according to the first embodiment, and the area overhead can be reduced.

The first regulator 100' regulates the voltage supplied from the control circuit 300' to generate the voltage VDD to be supplied as the specified voltage of the functional circuit module. However, the power supply capability is sufficient if the power obtained by subtracting the power supplied from the second regulator 200' can be supplied as the power to be supplied from the first regulator 100' to the functional circuit module. Therefore, the mounting area of the first regulator 100' according to the second embodiment can also be reduced as compared with the mounting area of the first regulator 100 according to the first embodiment.

The second regulator 200' regulates the voltage supplied from the control circuit 300' to generate the voltage VDD_PG to be supplied as the specified voltage of the functional circuit module. The voltage VDD is the same as the voltage VDD_PG. However, the power supply capability is sufficient if the power obtained by subtracting the power supplied from the first regulator 100' can be supplied as the power to be supplied from the second regulator 200' to the functional circuit module.

The control circuit 300' operates with the voltage VCC supplied from outside and controls the first regulator 100' and the second regulator 200' described above. Also, the control circuit 300' includes a switch control unit 310'.

The switch control unit 310' includes control lines for performing the ON/OFF control of the plurality of switch circuits (510_1, 510_2, 510_3, . . . 510_n, 520_1, 520_2, 520_3, . . . 520_n (n is a natural number of 4 or more)). When the functional circuit module is in the Active mode, the control lines (C1, C2, C3, C4, C5, C6, . . . Cx–1, Cx) control such that both the first switch circuit and the second switch circuit are turned on.

Identification information of the switch circuit to be turned on and the switch circuit to be turned off is written in the setting register 400. Therefore, the switch control unit 310' reads out the identification information of the setting register 400, identifies the switch circuit to be turned on and the switch circuit to be turned off, and determines the logic level of the control line.

The switch circuits (510_1, 510_2, 510_3, . . . 510_n, 520_1, 520_2, 520_3, . . . 520_n (n is a natural number of 4 or more)) can be semiconductor switches such as bipolar transistors or field effect transistors. The switch circuits 520_1, 520_2, 520_3, . . . 520_n are collectively referred to as first switch circuits in some cases. The switch circuits 510_1, 510_2, 510_3, . . . 510_n are collectively referred to as second switch circuits in some cases. The first switch circuit has a function of electrically connecting and disconnecting the first power supply line of the first regulator and the functional circuit module. Also, the second switch circuit has a function of electrically connecting and disconnecting the second power supply line of the second regulator and the functional circuit module. In the case of the Active mode, all the first switch circuits and all the second switch circuits are in the ON state.

The functional circuit modules (500_1, 500_2, 500_3, . . . 500_n (n is a natural number of 4 or more)) can be IP (Intellectual Property) similarly to the first embodiment.

In FIG. 13, all the functional circuit modules 500_1, 500_2, 500_3, and 500_n are electrically connected to the outputs of the first regulator 100' and the second regulator 200' via switch circuits. Therefore, all the functional circuit modules are in the Active mode and operable.

<Description of STBY Mode of Semiconductor Device 1000'>

Figure 14:
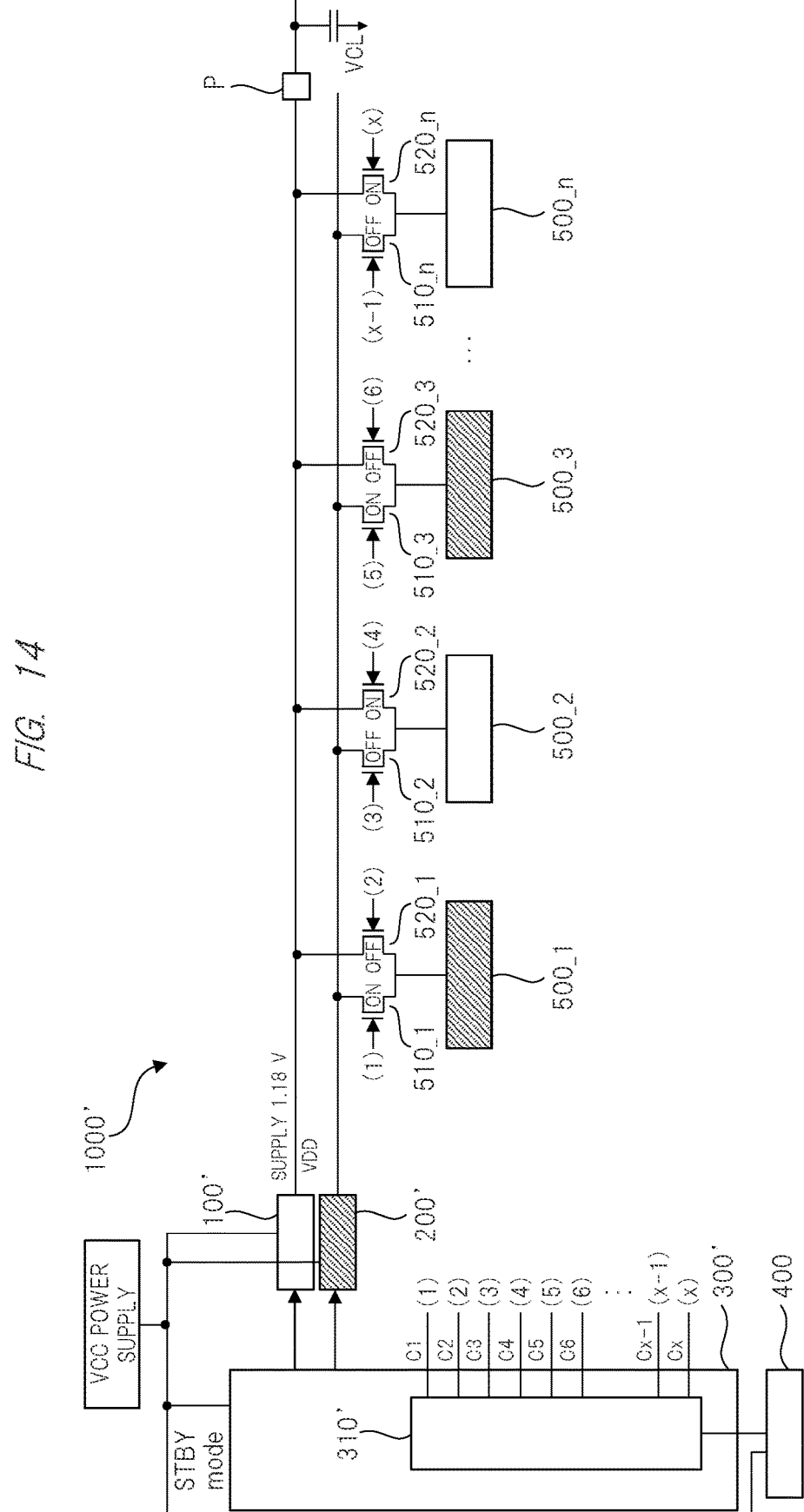
FIG. 14 is a block diagram showing an example of the configuration and operating state of the semiconductor device according to the second embodiment in the STBY mode.

FIG. 14 is a block diagram showing an example of the configuration and operating state of the semiconductor device 1000' according to the second embodiment in the STBY mode. The semiconductor device 1000' according to the second embodiment includes the first regulator 100', the second regulator 200', the control circuit 300', and the setting register 400 as described above. Furthermore, similarly to the first embodiment, the semiconductor device 1000' according to the second embodiment includes a plurality of functional circuit modules (500_1, 500_2, 500_3, . . . 500_n (n is a natural number of 4 or more)) and a plurality of switch circuits (510_1, 510_2, 510_3, . . . 510_n, 520_1, 520_2, 520_3, . . . 520_n (n is a natural number of 4 or more)).

Also, as shown in FIG. 14, the semiconductor device 1000' according to the second embodiment in the STBY mode includes one or more functional circuit modules to be in the power-off state. For example, since no voltage is supplied to the functional circuit modules 500_1 and 500_3 from the first regulator 100' and the second regulator 200' in FIG. 14, the functional circuit modules 500_1 and 500_3 are in the power-off state. In the STBY mode, the second power supply line, which is the output line of the second regulator 200', is at 0 volts or in a high impedance state.

Furthermore, as shown in FIG. 14, also in the semiconductor device 1000' according to the second embodiment in the STBY mode, the second switch circuits of the functional circuit modules 500_1 and 500_3 in the STBY mode are turned on. This is to quickly recover the functional circuit modules 500_1 and 500_3 in the power-off state to the Active mode. Also, the second switch circuits of the functional circuit modules 500_2 and 500_n in the power-on state are turned off. However, since the first switch circuits of the functional circuit modules 500_2 and 500_n are in the ON state, the voltage VDD is supplied to the functional circuit modules 500_2 and 500_n from the first regulator 100', and the functional circuit modules 500_2 and 500_n maintain the power-on state.

<Transition of Semiconductor Device 1000' from Active Mode to STBY Mode>

Figures 15A, 15B, 15C:
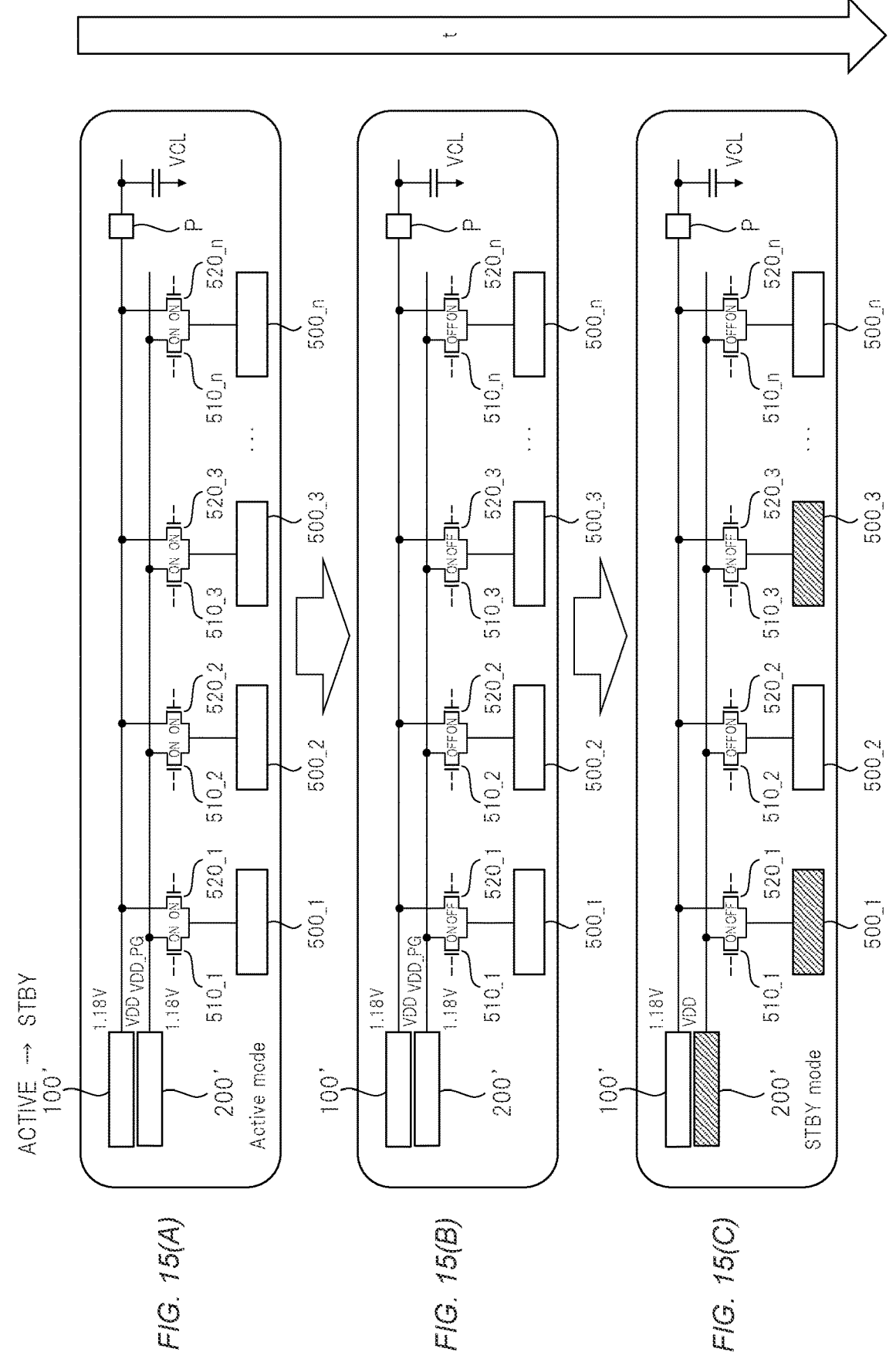
FIG. 15(A) is a block diagram showing in a simplified manner an example of the configuration and operating state of the semiconductor device according to the first embodiment in the Active mode.
FIG. 15(B) is a block diagram showing in a simplified manner an example of the operation during the transition of the semiconductor device according to the first embodiment from the Active mode to the STBY mode.
FIG. 15(C) is a block diagram showing in a simplified manner an example of the configuration and operating state of the semiconductor device according to the first embodiment in the STBY mode.

FIG. 15(A) to FIG. 15(C) are block diagrams illustrating the process of the semiconductor device 1000' according to the second embodiment transitioning from the Active mode to the STBY mode along with elapsed time. FIG. 15(A) is a block diagram showing the case where the semiconductor device 1000' is in the Active mode in a simplified manner. FIG. 15(B) is a block diagram showing in a simplified manner the operation during the transition of the semiconductor device 1000' from the Active mode to the STBY mode. FIG. 15(C) is a block diagram showing the case where the semiconductor device 1000' is in the STBY mode in a simplified manner. Since FIG. 15(A) shows a part of FIG. 13, detailed description thereof will be omitted. Also, since FIG. 15(C) shows a part of FIG. 14, detailed description thereof will be omitted.

When the semiconductor device 1000' is in the Active mode, the voltage VDD is supplied to the functional circuit modules included in the semiconductor device 1000' from the first regulator 100' via the first power supply line as shown in FIG. 15(A). Also, the functional circuit modules included in the semiconductor device 1000' receive the supply of the voltage VDD_PG also from the second regulator 200' via the second power supply line. Namely, both the first switch circuits and the second switch circuits are turned on.

In the transition process in which the semiconductor device 1000' transitions from the Active mode to the STBY mode, the semiconductor device 1000' operates as shown in FIG. 15(B). More specifically, the second switch circuit of the functional circuit module transitioning from the power-on state to the power-off state maintains the ON state, and the first switch circuit changes from the ON state to the OFF state. In this state, the functional circuit module that transitions from the power-on state to the power-off state also maintains the power-on state. In addition, at this time, the first switch circuit of the module that maintains the power-on state maintains the ON state, and the second switch circuit changes from the ON state to the OFF state.

As shown in FIG. 15(C), when the semiconductor device 1000' transitions from the transition process shown in FIG. 15(B) to the STBY mode, the output voltage of the second regulator 200' becomes 0 volts or the output of the second regulator 200' becomes high impedance. Therefore, the functional circuit module electrically connected to the second switch circuit in the ON state transitions to the power-off state. In the case of FIG. 15(C), the functional circuit modules 500_1 and 500_3 transition to the power-off state.

<Transition of Semiconductor Device 1000' from STBY Mode to Active Mode>

Figures 16A, 16B, 16C:
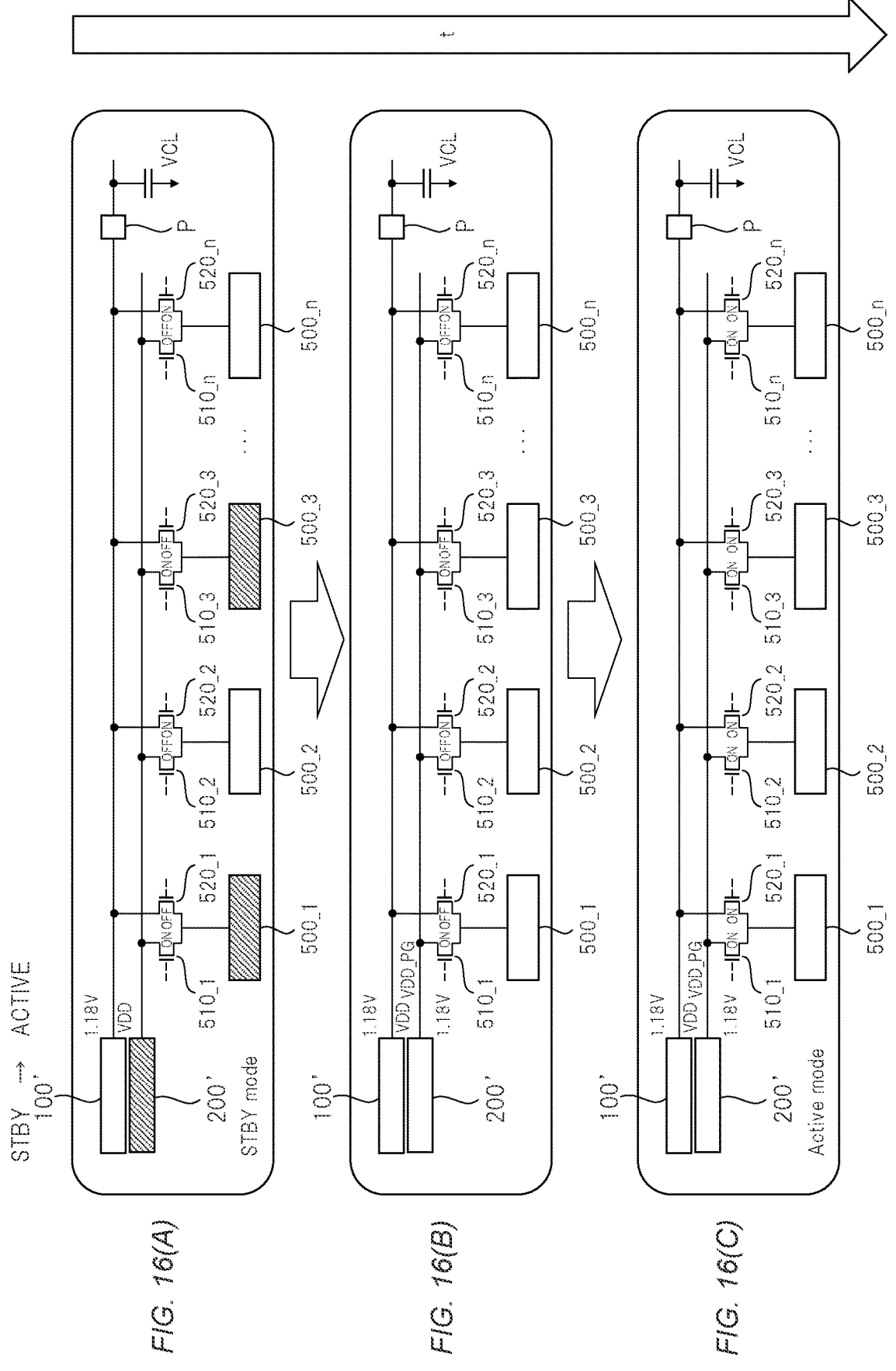
FIG. 16(A) is a block diagram showing in a simplified manner an example of the configuration and operating state of the semiconductor device according to the first embodiment in the STBY mode.
FIG. 16(B) is a block diagram showing in a simplified manner an example of the operation during the transition of the semiconductor device according to the first embodiment from the STBY mode to the Active mode.
FIG. 16(C) is a block diagram showing in a simplified manner an example of the configuration and operating state of the semiconductor device according to the first embodiment in the Active mode.

FIG. 16(A) to FIG. 16(C) are block diagrams illustrating the process of the semiconductor device 1000' transitioning from the STBY mode to the Active mode along with elapsed time. FIG. 16(A) is a block diagram showing the case where the semiconductor device 1000' is in the STBY mode in a simplified manner. FIG. 16(B) is a block diagram showing in a simplified manner the operation during the transition of the semiconductor device 1000' from the STBY mode to the Active mode. FIG. 16(C) is a block diagram showing the case where the semiconductor device 1000' is in the Active mode in a simplified manner. FIG. 16(A) shows the same state as that in FIG. 15(C) in which the semiconductor device 1000' is in the STBY mode. FIG. 16(B) shows the same state as that of the semiconductor device 1000' in FIG. 15(B). FIG. 16(C) shows the same state as that in FIG. 16(A) in which the semiconductor device 1000' is in the Active mode.

In the functional circuit modules in the power-off state in FIG. 16(A), the second switch circuits are in the ON state. In FIG. 16(B), when the second regulator 200' starts outputting voltage, the functional circuit modules electrically connected to the second switch circuits in the ON state are charged up from the power-off state (0 volts) to the voltage VDD_PG. In this case, the output voltage of the second regulator 200' changes from the initial voltage to the voltage VDD_PG. At this time, the voltage drop described with reference to FIG. 1(B) does not occur in the functional circuit modules that do not suspend operation even in the STBY mode such as the functional circuit modules 500_2 and 500_n. This is because the functional circuit modules 500_2 and 500_n are electrically isolated from the voltage VDD_PG. Also, during the rise time when the output voltage of the second regulator 200' changes from the initial voltage to the voltage VDD_PG, all the functional circuit modules electrically connected to the second switch circuits in the ON state are charged up from the STBY mode (0 volts) to the voltage VDD_PG.

In FIG. 16(C), the functional circuit module charged up to the voltage VDD_PG maintains the second switch circuit in the ON state and turns on the first switch circuit. Also, at this time, the second switch circuits (510_2, 510_n) of the modules (500_2, 500_n) that maintain the power-on state by the voltage VDD change to the ON state. Therefore, all the functional circuit modules set the voltage VDD supplied from the first regulator 100' and the voltage VDD_PG supplied from the second regulator 200' as the power supply voltage. Note that, since all the functional modules are charged up at the time of the switching of the switch circuits from FIG. 16(B) to FIG. 16(C), the drop of the power supply voltage supplied to the functional circuit module does not occur.

With the configuration and operation of the semiconductor device 1000' according to the second embodiment described above, in addition to the effect by the semiconductor device 1000 according to the first embodiment, the combined mounting area of the first regulator 100' and the second regulator 200' according to the second embodiment is equal to the mounting area of the first regulator 100 according to the first embodiment. Namely, the mounting area of the regulator according to the second embodiment can be reduced by the area of the regulator 200 according to the first embodiment as compared with the mounting area of the regulator according to the first embodiment, and the area overhead can be reduced.

In the foregoing, the invention made by the inventor has been specifically described above based on embodiments. However, it is needless to say that the present invention is not limited to the above embodiments and the present invention can be modified in various manners within the range not departing from the gist thereof. For example, the above embodiments have described the present invention in detail in order to make the present invention easily understood, and the present invention is not necessarily limited to those having all the described configurations. Also, another configuration may be added to a part of the configuration of the embodiment above, and a part of the configuration of the embodiment may be eliminated or replaced with another configuration.

What is claimed is:

1. A semiconductor device comprising:
a first regulator electrically connected to a first power supply line;
a second regulator electrically connected to a second power supply line;
a control circuit configured to control the first regulator and the second regulator; and
at least two or more functional circuit modules electrically connectable to the first power supply line and the second power supply line,
wherein, when the functional circuit modules are set to an active mode, the control circuit controls the first regulator to output a voltage to the first power supply line and the second regulator to output a voltage to the second power supply line, wherein, when the functional circuit modules are set to a standby mode, the control circuit controls the first regulator to output a voltage to the first power supply line and the second regulator not to output a voltage to the second power supply line, and
wherein the control circuit includes a setting register configured to set each functional circuit module to the standby mode operation continuation module or the standby mode operation suspension module.

2. The semiconductor device according to claim 1,
wherein the functional circuit modules include i) a standby mode operation suspension module that suspends operation in the standby mode and ii) a standby mode operation continuation module that does not suspend operation even in the standby mode,
wherein the control circuit controls the standby mode operation continuation module to be electrically connected to the first power supply line in both the active mode and the standby mode, and
wherein the control circuit controls the standby mode operation suspension module to be electrically connected to the first power supply line in the active mode and to be electrically connected to the second power supply line in the standby mode.

3. The semiconductor device according to claim 2,
wherein a first switch circuit is interposed between the functional circuit modules and the first power supply line, and a second switch circuit is interposed between the functional circuit modules and the second power supply line,
wherein the control circuit controls the first switch circuit to an ON state when electrically connecting the functional circuit module and the first power supply line, and
wherein the control circuit controls the second switch circuit to an ON state when electrically connecting the functional circuit module and the second power supply line.

4. The semiconductor device according to claim 3,
wherein the control circuit controls the functional circuit modules as the standby mode operation continuation module or the standby mode operation suspension module in accordance with the setting of the setting register.

5. A power supply control processing method for the control circuit of the semiconductor device according to claim 4, the method comprising:
a transition step of transitioning from the active mode to the standby mode,
wherein the transition step includes:
a step of controlling, to an OFF state, the first switch circuit electrically connected to the standby mode operation suspension module set to the standby mode operation suspension module by the setting register, and controlling, to an ON state, the second switch circuit electrically connected to the standby mode operation suspension module; and
a step of stopping the output of the second regulator.

6. A power supply control processing method for the control circuit of the semiconductor device according to claim 4, the method comprising:
a recovery step of recovering from the standby mode to the active mode,
wherein the recovery step includes:
a step of causing the output of the second regulator to transition from a stopped state to an output state; and

a step of controlling, to an ON state, the first switch circuit electrically connected to the standby mode operation suspension module set to the standby mode operation suspension module by the setting register, and controlling, to an OFF state, the second switch circuit electrically connected to the standby mode operation suspension module.

7. A power supply control processing method for the control circuit of the semiconductor device according to claim 4, the method comprising:

a step of supplying a first voltage from the first regulator to the first power supply line, supplying a second voltage from the second regulator to the second power supply line, controlling the first switch circuit to an ON state, controlling the second switch circuit to an ON state, and setting all the functional circuit modules to an active mode.

8. The power supply control processing method for the control circuit of the semiconductor device according to claim 7, the method further comprising:

a transition step of transitioning from the active mode to the standby mode, wherein the transition step includes:

a step of controlling, to the ON state, the first switch circuit electrically connected to the standby mode operation continuation module set by the setting register, and controlling, to the OFF state, the second switch circuit electrically connected to the standby mode operation continuation module;

a step of controlling, to the OFF state, the first switch circuit electrically connected to the standby mode operation suspension module set by the setting register, and controlling, to the ON state, the second switch circuit electrically connected to the standby mode operation continuation module; and a step of stopping the output of the second regulator.

9. The power supply control processing method for the control circuit of the semiconductor device according to claim 7, the method further comprising:

a recovery step of recovering from the standby mode to the active mode, wherein the recovery step includes:

a step of causing the output of the second regulator to transition from a stopped state to an output state;

a step of controlling, to the ON state, the first switch circuit electrically connected to the standby mode operation suspension module set by the setting register, and controlling, to the ON state, the second switch circuit electrically connected to the standby mode operation continuation module; and a step of controlling, to the ON state, the first switch circuit electrically connected to the standby mode operation continuation module set by the setting register, and controlling, to the ON state, the second switch circuit electrically connected to the standby mode operation continuation module.

* * * * *